United States Patent [19]

Tsuru et al.

[11] Patent Number: 5,132,573
[45] Date of Patent: Jul. 21, 1992

[54] SEMICONDUCTOR GATE ARRAY DEVICE COMPATIBLE WITH ECL SIGNALS AND/OR TTL SIGNALS

[75] Inventors: Yoshihiro Tsuru, Kodaira; Takashi Kuraishi, Takasaki; Fumiaki Matsuzaki, Takasaki; Takaharu Morishige, Takasaki, all of Japan

[73] Assignees: Hitachi, Ltd.; Hitachi Microcomputer System Ltd., both of Tokyo, Japan

[21] Appl. No.: 618,691

[22] Filed: Nov. 27, 1990

[30] Foreign Application Priority Data

Nov. 27, 1989 [JP] Japan .................. 1-306972

[51] Int. Cl.$^5$ .............. H03K 19/0175; H03K 19/086; H03K 19/02
[52] U.S. Cl. .................... 307/475; 307/446; 307/455; 307/456
[58] Field of Search ................ 307/475, 455, 443, 446

[56] References Cited

U.S. PATENT DOCUMENTS

| | | | |
|---|---|---|---|
| 4,527,079 | 7/1985 | Thompson | 307/475 |
| 4,625,129 | 11/1986 | Ueno | 307/455 |
| 4,636,665 | 1/1987 | McLaughlin | 307/446 |
| 4,670,673 | 6/1987 | Varadarajan | 307/455 |
| 4,697,109 | 9/1987 | Honma et al. | 307/475 |
| 4,849,659 | 7/1989 | West | 307/475 |
| 4,945,265 | 7/1990 | Estrada | 307/455 |

OTHER PUBLICATIONS

BiCMOS Technology for High Performance VLSI Circuits, Lee et al.; Aug. 1984.

*Primary Examiner*—David Hudspeth
*Assistant Examiner*—Andrew Sanders
*Attorney, Agent, or Firm*—Antonelli, Terry Stout & Kraus

[57] ABSTRACT

A semiconductor gate array device compatible with ECL and/or TTL, wherein the input buffer unit includes a TTL input stage, an ECL input stage and a common output stage, and the output buffer unit includes a common input stage, an ECL output stage and a TTL output stage. When the device is to be used as a TTL input interface, the TTL input stage and the common output stage are coupled together and when the device is to be used as an ECL input interface, the ECL input stage and the common output stage are coupled together. When used as a TTL output interface, the common input stage and the TTL output stage are coupled together and when used as an ECL output interface, the common input stage and the ECL output stage are coupled together. Therefore, the input/output interfaces exhibit general applicability to meet the user's demands, yet enabling the layout areas of the input and output buffer portions to be decreased.

24 Claims, 18 Drawing Sheets

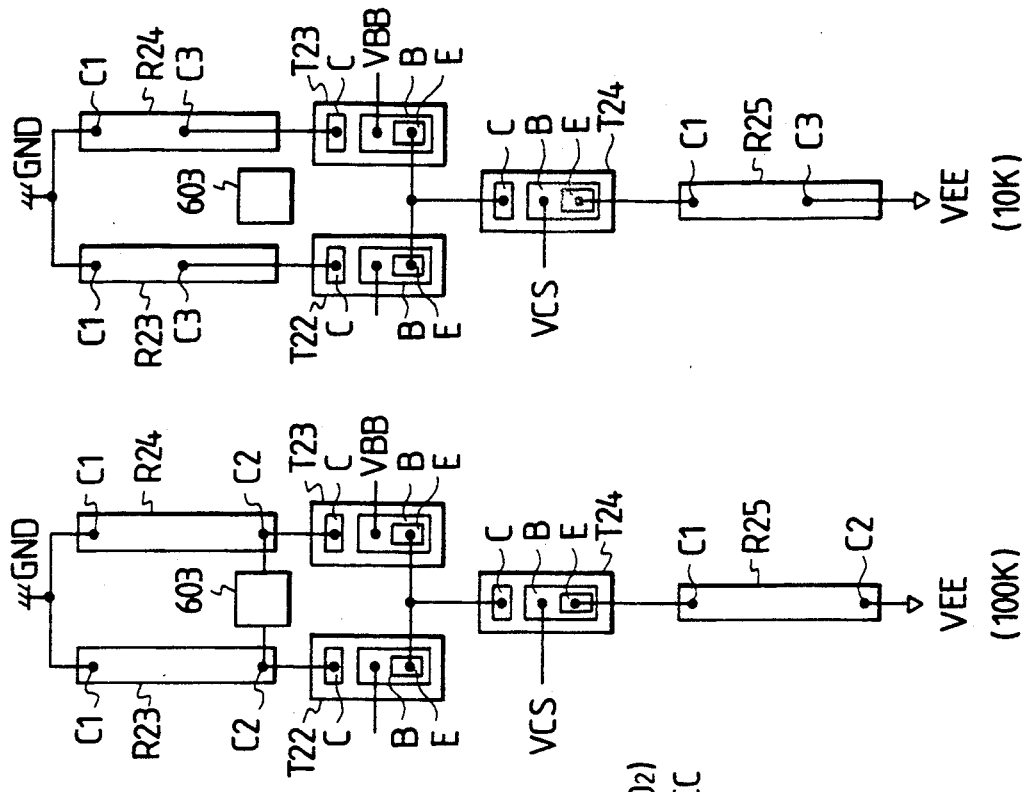
FIG. 4(d)
FIG. 4(c)
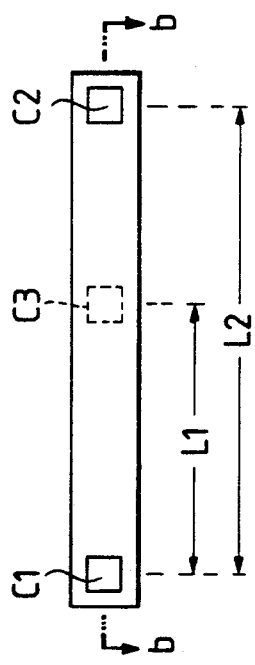
FIG. 4(a)
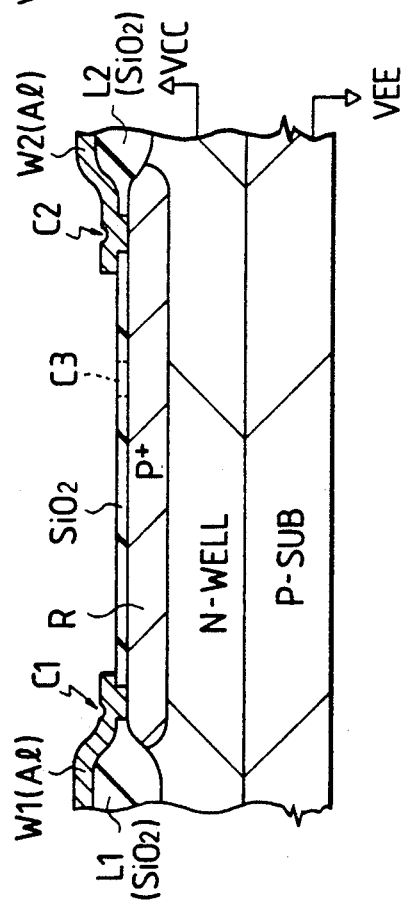
FIG. 4(b)

SEMICONDUCTOR GATE ARRAY DEVICE COMPATIBLE WITH ECL SIGNALS AND/OR TTL SIGNALS

BACKGROUND OF THE INVENTION

The present invention relates to a semiconductor integrated circuit device, and particularly to technology that can be effectively utilized for semi-custom LSIs (large scale integrated circuits) such as gate arrays.

Semiconductor integrated circuit devices such as gate arrays are usually produced in small numbers but in a variety of kinds. Therefore, the manufacturers of semiconductor devices offer base chips for gate arrays having a plurality of gates to meet wide demands of the users. In order to realize a circuit demanded by the user on the base chip, the manufacturer forms a plurality of photomasks for fabricating a user's circuit, and forms wirings among the gates on the base chip by using the mask thereby to obtain a gate array demanded by the user. Therefore, a single chip base is used for fabricating a plurality of semiconductor devices having different functions.

In order to further enhance the general applicability of the gate array itself, the present inventors have studied technology to make it possible to select the input or output interface (signal level that can be input and output) of the gate array out of a plurality of input and output interfaces. The input or output interface portion includes a TTL interface and an ECL interface. Further, the ECL interface must be provided in two types; i.e., an interface of 10-K specification of which the output signals vary depending upon the temperature, and an interface of 100-K specification of which the output signals do not vary depending upon the temperature. It was therefore learned that the input and output buffers of the gate array must be so designed as to be capable of coping with the above interfaces.

The present inventors have studied to provide an efficient layout of input and output buffers to impart general applicability to the input and output interfaces and have accomplished the present invention.

A Bi-CMOS circuit used for the gate arrays has been taught in a journal "VLSI DESIGN", August, 1984, pp. 98-100.

SUMMARY OF THE INVENTION

It is an object of the present invention to provide a semiconductor integrated circuit device which features an increased degree of freedom for selecting the input and output interfaces.

Another object of the present invention is to provide a semiconductor integrated circuit device equipped with a level converting circuit that realizes a high operation speed and simplicity in the circuit setup.

The above as well as other objects and novel features of the present invention will become obvious from the description of the specification and the accompanying drawings.

Among the inventions disclosed in the present application, a representative example will be briefly described below. The input buffer unit of the gate array according to the present invention has a first input stage which converts input signals of a TTL level into signals of an ECL level, a second input stage which receives signals of the ECL level and generates output signals of the ECL level, and an output stage that is alternatively connected to said first input stage or said second input stage depending upon the specifications of the input interface. The output stage includes a buffer circuit which contains, for example, an ECL circuit, and further includes a level converting circuit that converts the output signal (ECL level) of the buffer circuit into a signal of, for example, the CMOS level which is different from the ECL level.

The output buffer circuit unit includes an input stage for receiving outputs from an internal circuit, a first output stage that converts output signals of the ECL level produced from said input stage into those of the TTL level, and a second output stage that receives output signals of the ECL level produced from the input stage and produces output signals of the ECL level. The input stage includes a level converting circuit that converts the output signals of, for example, the CMOS level produced from the internal circuit into those of the ECL level, and the output of the level converting circuit is alternatively connected to either the input of the first output stage or to the input of the second output stage depending upon the specifications of the output interface. In order to select output signals of 10-K specification and output signals of 100-K specification of the ECL interface, contact portions are formed at an intermediate portion and at both ends of a resistor element to obtain two kinds of resistances. The above resistor element is used to constitute a load resistor element connected to the collectors of differential transistors that receive output signals of the ECL level, to constitute an emitter resistance element of a constant-current source connected to the common emitter of the differential transistors, and to constitute a resistor element that determines the temperature characteristics of a power source circuit that produces a constant voltage applied to the above constant-current source. The resistor element is so constructed that the resistance thereof can be changed depending upon the 10-K specification and the 100-K specification.

To cope with the 100-K specification, a temperature compensation circuit is connected across the two collectors of the differential transistors.

In the above output buffer unit, the collector load resistor of the differential transistors that receive ECL signals and a reference voltage corresponding thereto, is connected, depending upon the output specification, to ground potential that corresponds to the ECL output circuit or to positive power source voltage that corresponds to the TTL output circuit, and the ECL output circuit or the TTL output circuit is selectively connected depending on the output signal of the level converting circuit.

The level converting circuit of the input buffer unit includes a pair of p-channel MOSFETs that receive through the gates thereof the signals of the ECL level having opposite phases relative to each other, a pair of n-channel input and output MOSFETs of a current mirror form that receive output from the drain of either one of the above pair of p-channel MOSFETs, and totem pole-type push-pull bipolar output transistors driven by signals output from the sources of the n-channel output MOSFETs and by signals output from the drains of the p-channel MOSFETs.

When the TTL input signals form a critical path, the internal logic circuit that receives both the TTL input signals and the ECL input signals constitutes a first internal gate to receive input signals that have passed through the first input stage of the input buffer unit (TTL input buffer) and/or signals converted from the ECL level into the TTL level by the level converting circuit. When the ECL input signals form a critical path, the internal logic circuit that receives both the TTL input signals and the ECL input signals constitutes a second internal gate to receive input signals that have passed through the second input stage of the input buffer unit (ECL input buffer) and/or the signals converted from the TTL level into the ECL level by the level converting circuit.

The above-mentioned means makes it possible to select an input interface of either one or both of the TTL or the ECL depending upon the user's specification using one semiconductor integrated circuit device. Furthermore, the ECL output interface makes it possible to select the 10-K specification having temperature dependency or the 100-K specification without having temperature dependency without substantially increasing the resistance element.

Moreover, the collector load resistor of a differential transistor that receive the ECL signals and a reference voltage corresponding thereto is connected, depending upon the output specification, to ground potential that corresponds to the ECL output circuit or to a positive power source voltage that corresponds to the TTL output circuit, in order to selectively form the output signal of the ECL level or the TTL level using the same differential circuit.

Furthermore, totem pole-type push-pull output transistors connected in cascade are driven by a MOSFET of the output side of the current mirror form that receives the drain output from either one of a pair of p-channel MOSFETs and by another p-channel MOSFET, and whereby the level conversion operation and the driving operation are commonly utilized enabling the circuit to be simplified, the layout area to be decreased, and the operation speed to be increased.

The logic circuit is arranged on the TTL side or on the ECL side depending upon the critical path while permitting the TTL input and the ECL input to exist together, and high-speed operation is thus realized.

BRIEF DESCRIPTION OF THE DRAWINGS

FIG. 4(a) is a diagram of a pattern illustrating an embodiment of a resistor element used in the output circuit of FIG. 3;

FIG. 4(b) is a section view along the line b—b' of FIG. 4(a);

FIG. 4(c) is a diagram of layout of 100-K specification using the resistor of FIG. 4(a);

FIG. 4(d) is a diagram of layout of 10-K specification using the resistor of FIG. 4(a);

DESCRIPTION OF THE PREFERRED EMBODIMENTS

Figure 1:
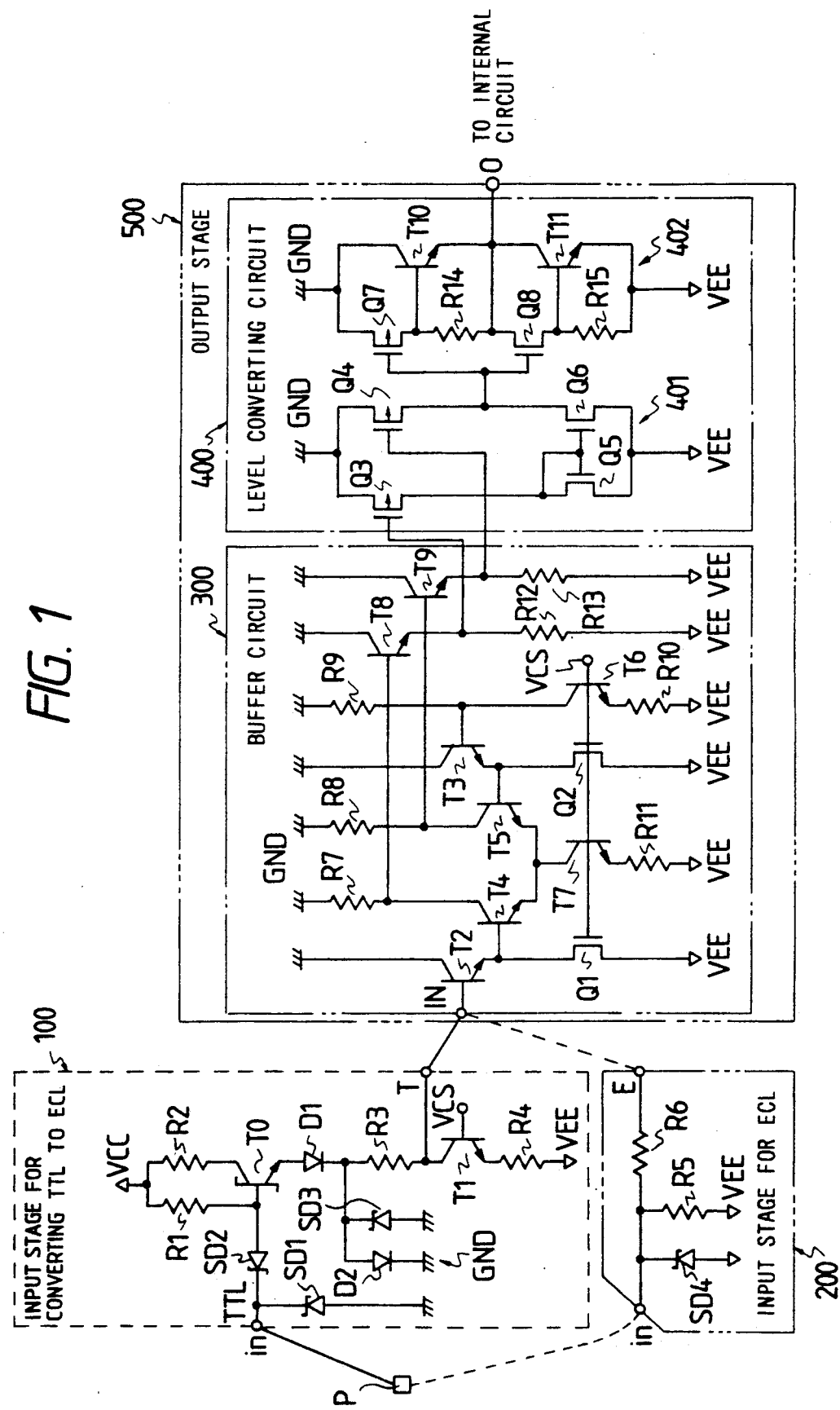
FIG. 1 is a circuit diagram illustrating an embodiment of an input interface unit in a semiconductor integrated circuit device according to the present invention.

FIG. 1 is a concrete circuit diagram of an embodiment of an input interface unit in a semiconductor integrated circuit device according to the present invention. Though there is no particular limitation, the circuit elements in FIG. 1 are formed on a semiconductor substrate such as of single crystalline silicon by the widely known Bi-CMOS technology. In FIG. 1, the p-channel MOSFETs are distinguished from the n-channel MOSFETs by putting arrow to the channel portion (back gate portion) thereof. This holds true hereinafter even in other circuit diagrams.

In the semiconductor integrated circuit device of this embodiment, the input interface for TTL is comprised of a TTL/ECL level converting input stage 100 that is a first input stage, and the input interface for ECL is comprised of an ECL input stage 200 that is a second input stage, in order to give an increased degree of freedom for the input interfaces.

The TTL/ECL level converting stage 100 is constituted by a TTL input stage and a level converting stage that forms output signals of the ECL level. The TTL input stage is constituted by a Schottky diode SD1 and a resistor R1. The Schottky diode SD1 exhibits the level clamping action for the undershoot of an input signal. The output signal of the TTL input stage is fed to the base of an npn transistor T0. A collector resistor R2 of the transistor T0 and the above resistor R1 are served with a positive power source voltage VCC. To the emitter of the transistor T0 are connected in series a level-shifting diode D1 for converting signals into those of the ECL level, a resistor R3, a transistor T1 that constitutes a constant-current source, and an emitter resistor R4 thereof. Further, a diode D2 and a Schottky diode D3 are connected between a point where the diode D1 and resistor R3 are connected together and a point of ground potential that serves as a reference potential for the ECL level. A constant voltage VCS for ECL is applied to the base of the constant-current transistor T1. An ECL signal whose level is converted is produced from a terminal connected to the collector of the transistor T1. In order to prevent the converted ECL level from being changed by a change in the positive power source voltage VCC, there are provided a diode D2 and a Schottky diode SD3 that work as a level limiter with ground potential as a reference like the ECL level. This makes it possible to reliably maintain the level margin in the through buffer that will be described later.

The ECL input stage 200 is constituted by a Schottky diode SD4, a resistor R5 connected in parallel therewith, and a resistor R6 inserted in series with an ECL input signal path.

In this embodiment, the above two input stages are fabricated to correspond to one external input terminal of the semiconductor integrated circuit device. There are provided a buffer circuit 300 commonly for the pair of input stages, and a common succeeding-stage circuit 500 that includes a level converting circuit 400 that converts signals of the ECL level into those of the BCL level (CMOS level). The buffer circuit 300 is fundamentally constituted by the ECL circuit. That is, an input signal is fed to the base of a differential transistor T4 via an emitter follower circuit consisting of an input transistor T2 and a MOSFET Q1 that is connected to the emitter thereof and that works as a constant-current source. Though there is no particular limitation, a reference voltage VBB is obtained by flowing through a resistor R9 a constant current formed by a constant-current source that consists of a transistor T6 receiving the constant voltage VCS and an emitter resistor R10. The reference voltage VBB is supplied to the base of a differential transistor T5 via an emitter follower circuit that consists of an input transistor T3 and a MOSFET Q2 that works as a constant-current source just like the above circuit. A constant-current source consisting of a constant-current transistor T7 and an emitter resistor R11 is connected to the emitters of the differential transistors T4 and T5. A constant voltage VCS is commonly supplied to the bases of the transistors T6, T7 and to the gates of the MOSFETs Q1, Q2 that constitute the constant-current sources.

Load resistors R7 and R8 are connected to the collectors of the differential transistors T4 and T5. Collector outputs of the differential transistors T4 and T5 are fed to the next level converting circuit 400 via emitter follower circuits consisting of output transistors T8, T9 and emitter resistors R12, R13.

The level converting circuit 400 converts the signals of the ECL levels into those of the CMOS level or the BCL (Bi-CMOS composite gate) level. That is, in this embodiment, though there is no particular limitation, the internal logic gate circuit is constituted by a Bi-CMOS circuit that is capable of operating at high speeds while accomplishing high degree of integration and decreased consumption of power as will be described later. The level converting circuit 400 is constituted by a level amplification stage circuit 401. Complementary signals formed by the buffer circuit 300 are fed to the gates of p-channel amplifier MOSFETs Q3 and Q4. The drain of the above one amplifier MOSFET Q3 is coupled to the drain of an input MOSFET Q5 between n-channel input and output MOSFETs Q5 and Q6 of the current mirror form. On the other hand, the drain of the output MOSFET Q6 is connected to the drain of the other amplifier MOSFET Q4, and an amplified output signal is supplied from the connection point thereof to the input of the output circuit 402 of the next stage.

When the emitter output of the transistor T8 has the low level of ECL level and when the emitter output of the transistor T9 has the high level of ECL level, a current flowing into the MOSFET Q3 becomes relatively greater than the current flowing into the MOSFET Q4. In this case, a large current also flows into n-channel MOSFETs Q5 and Q6 of the current mirror form in response to a drain current formed by the MOSFET Q3. Therefore, the p-channel MOSFET Q4 and the n-channel MOSFET Q6 are operated in a complementary manner. Therefore, the output signal produced from the commonly connected drains has a low level such as of a negative power source voltage VEE corresponding to a conductance ratio thereof. Conversely, when the current flowing into the MOSFET Q4 becomes relatively greater than the current flowing into the MOSFET Q3, there is formed a signal of the high level nearly equal to ground potential of the circuit.

In this embodiment, provision is made of a BCL output circuit 402 consisting of a bipolar CMOS logic circuit (BCL) in order to increase the output current or, in other words, in order to drive at high speeds the load capacity consisting of input capacities such as of CMOS circuit connected to the output thereof and wiring capacities. The level-converted output is fed to the gates of a p-channel MOSFET Q7 and an n-channel MOSFET Q8. The drain of the p-channel MOSFET Q7 is connected to the base of the output transistor T10 that produces an output signal of the high level. A resistor R14 for draining the base charge is provided between the base and emitter of the output transistor T10. The drain of the n-channel MOSFET Q8 is connected to an output terminal 0, and the source thereof is connected to the base of an output transistor T11 that forms an output signal of the low level. A resistor R15 for draining the base charge is provided between the base and the emitter of the output transistor T11. The emitter of the transistor T11 is connected to the negative power source voltage VEE as shown.

According to this embodiment, provision is made of the first input stage 100 for the TTL level and the second input stage 200 for the ECL level. Therefore, the device can be adapted to either the TTL input interface or the ECL input interface depending upon the user's specification. When, for instance, the TTL input interface is desired, the output terminal T of the TTL/ECL converting stage 100 is connected to the input terminal IN of the buffer circuit 300 as represented by a solid line in FIG. 1. When the ECL input interface is desired, the output terminal E of the ECL input stage 200 is connected to the input terminal IN of the buffer circuit 300 as indicated by a dotted line in FIG. 1. Similarly, in the case of the TTL interface, the external terminal P is connected to the input of the TTL/ECL converting circuit 100 as indicated by a solid line and in the case of the ECL interface, the external terminal P is connected to the input of the ECL input stage 200 as indicated by a dotted line.

Figure 7:
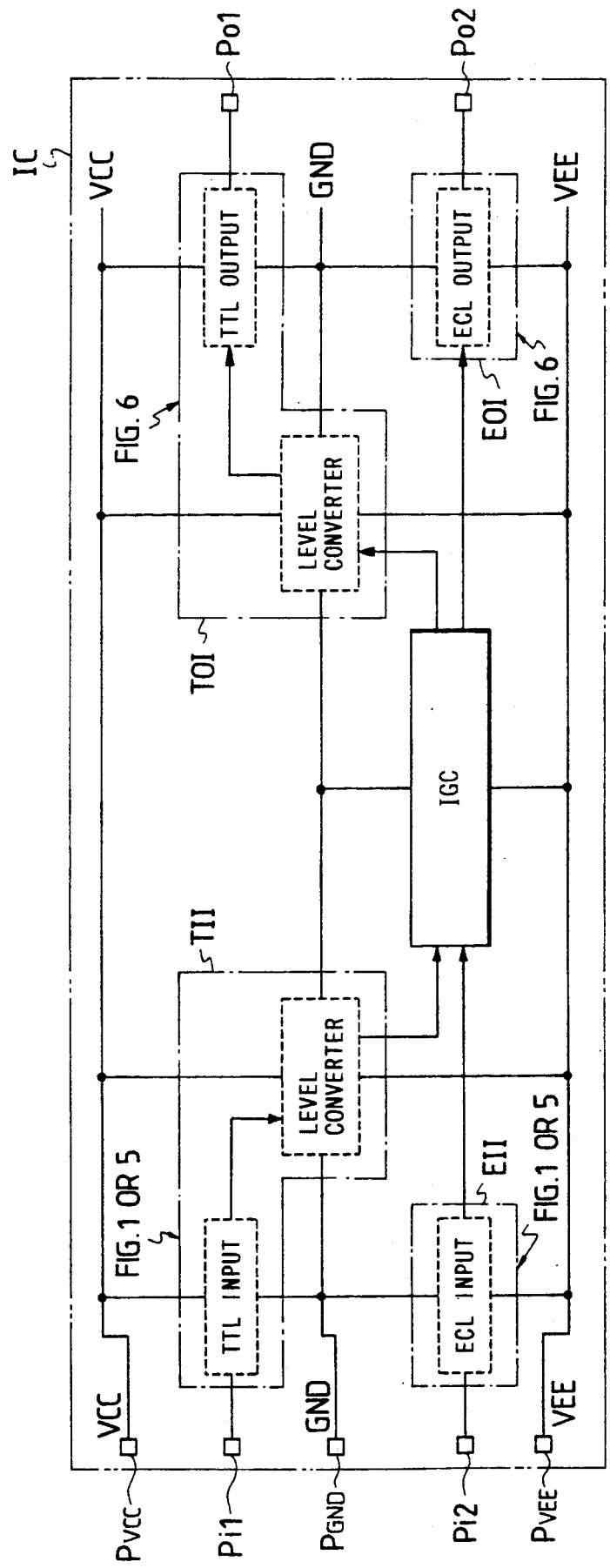
FIG. 7 is a block diagram of an embodiment of the semiconductor integrated circuit device according to the present invention.

In this case, the internal gate circuit may be comprised of a BCL circuit which is operated by a positive voltage VCC for TTL and by ground potential GND of the circuit. In this case, however, a bias voltage such as the negative voltage VEE is applied to the p-type semiconductor substrate since the negative voltage VEE is used for the interface for ECL. Therefore, a low voltage is applied to the back gate portion of the n-channel MOSFET and strict limitation is imposed on the breakdown voltage thereof; i.e., particular attention is required in regard to the breakdown voltage of the n-channel MOSFET. In the semiconductor integrated circuit device having interfaces for both TTL and ECL, therefore, if the internal gate is constituted like a BCL circuit that operates on a voltage between the negative voltage VEE and GND as shown in FIG. 7, no particular attention needs be given in regard to the breakdown voltage of the n-channel MOSFET.

Figure 2:
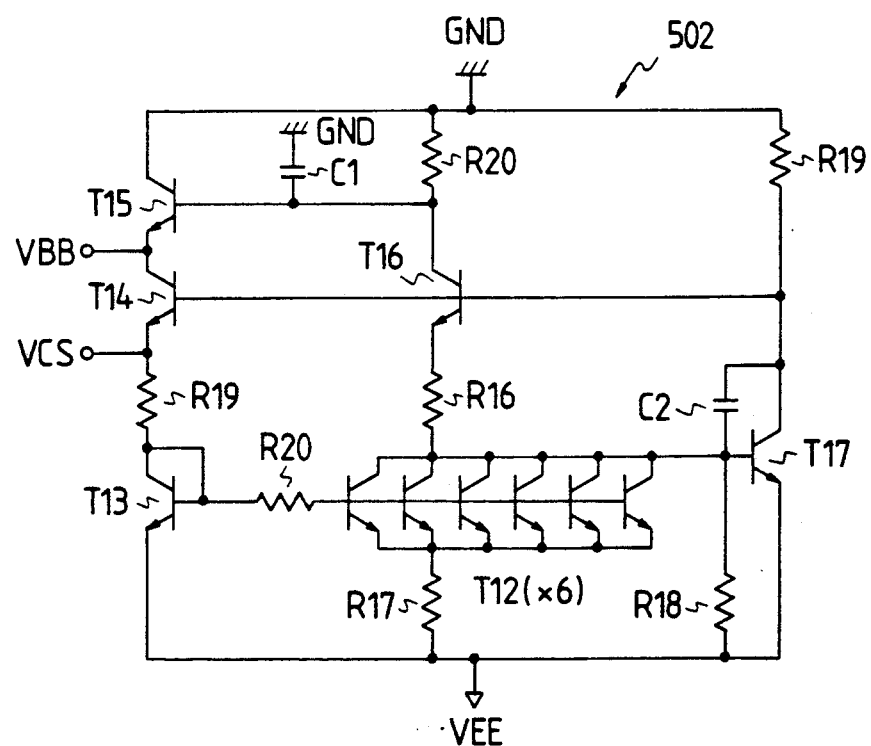
FIG. 2 is a circuit diagram of an embodiment of a power source circuit.

FIG. 2 is a diagram showing an embodiment of a power source circuit used for the ECL circuit. The power source circuit 502 of this embodiment is the same as the power source circuit used for the ECL circuit of the so-called 100K type, and works to cancel the temperature characteristics of the constant voltage VCS if the ratio of a resistance R16 to a resistance R17 and a ratio of the resistance R17 to resistance R19 are suitably set. In the above circuit 502, it is presumed that the transistors T14 and T16 have an equal base-emitter voltage. By so setting the resistance ratios, the constant voltage VCS no more varies depending upon the power source or the temperature. The power source circuit 502 is utilized for determining the temperature characteristics of the output circuit that is described below.

Figure 3:
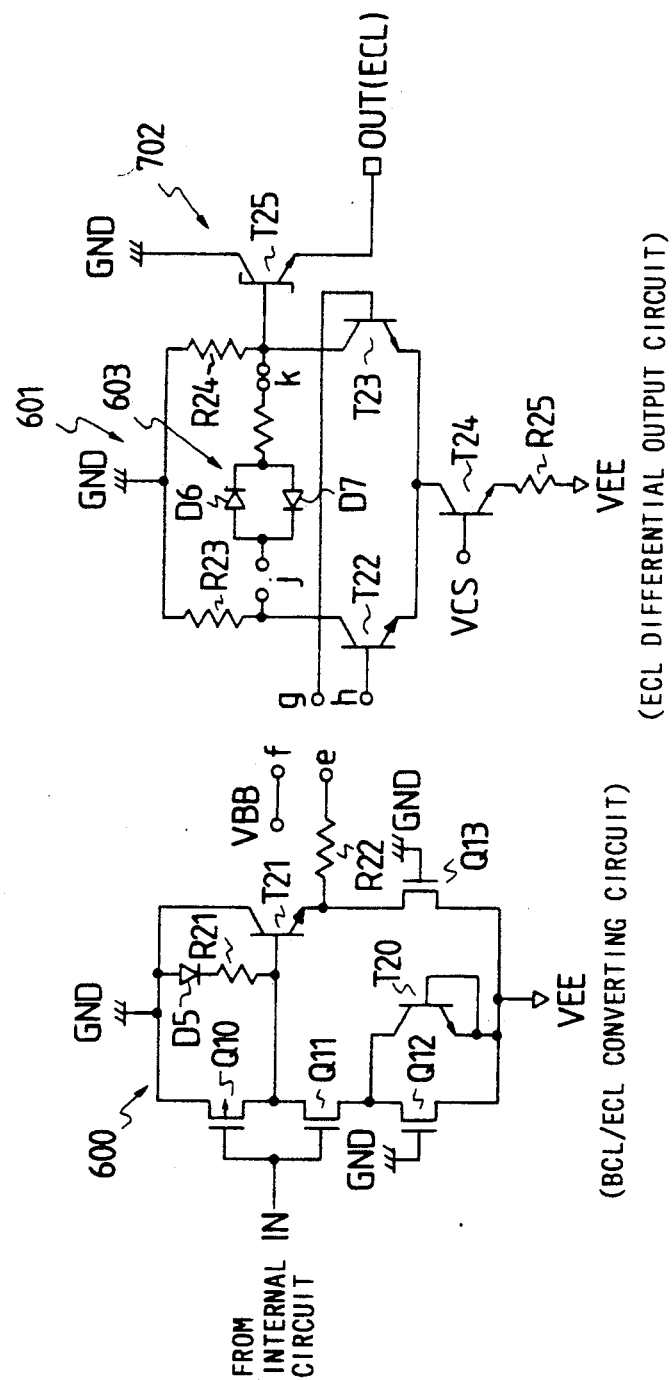
FIG. 3 is a circuit diagram of an embodiment of an output interface unit.

FIG. 3 is a diagram of an embodiment of the ECL output circuit. In the ECL circuit of this embodiment, a BCL/ECL level converting circuit 600 is provided in the preceding stage of the output circuit in order to convert the output signals formed by the internal logic circuit of the BCL constitution into signals of the ECL level. In the level converting circuit 600, an n-channel MOSFET Q12 is connected in series with the p-channel MOSFET Q10 and the n-channel MOSFET Q11 that receive the input signal IN, and a capacitor element T20 that works as a speed-up capacitor is connected in parallel with the MOSFET Q12. The diode D5 and a resistor R21 are connected to the output unit of the CMOS circuit that includes the MOSFETs $Q_{10}$ and $Q_{11}$, and the output signal of the ECL level is formed through an emitter follower output transistor T21. The emitter of the output transistor T21 is connected to the MOSFET Q13 that serves as a constant-current source. Gates of the MOSFETs Q12 and Q13 that work as constant-current sources are steadily connected to a ground potential point GND.

Though there is no particular limitation in this embodiment, the above output signal is output to a terminal e through a resistor R22. The reference voltage VBB produced from, for example, the power source circuit of FIG. 2 is applied to the terminal f and is selectively connected to the terminal h or g that corresponds to the bases of the ECL differential transistors T22 and T23. That is, depending upon the combination of connection of these terminals or, in other words, by selectively supplying the above level-converted input signal and the reference voltage VBB to the bases of the transistors T22 and T23, the ECL output circuit 601 can be switched to work either as a through buffer (non-inverted buffer) or as an inverting buffer.

Further, the output circuit 601 of this embodiment has a selection function of whether the output level should have 100-K specification without temperature dependency or 10-K specification with a predetermined temperature dependency.

That is, the collectors of the differential transistors T22 and T23 are coupled to collector load resistors R23 and R24, and the emitters thereof are connected to a constant-current transistor T24 that is served with a constant voltage VCS through the base thereof and that has an emitter resistor R25 connected to the emitter thereof. Though there is no particular limitation, the collector of the transistor T23 is connected to the base of the output transistor T25 of the open-emitter structure that works as an ECL output circuit 702.

According to this embodiment, in order to selectively obtain the output circuit of the 10K type or the 100K type as described above, diodes D6 and D7 for temperature compensation (temperature compensation circuit 603) are provided between the collectors of the differential transistors T22 and T23.

For instance, when the output circuit of 100-K specification is to be obtained, the connection terminals j and k are connected together, and the temperature compensation circuit 603 is connected between the collectors of differential transistors T22 and T23. The power source circuit 502 of FIG. 2 is so constructed that the output constant voltage VCS will not vary depending upon the temperature. When the output circuit of 10-K specification is to be obtained, on the other hand, the terminals j and k are not connected together. Furthermore, the resistance of the resistor R20 in the power source circuit 502 of FIG. 2 is so changed that the constant voltage VCS will have a predetermined temperature dependency. Moreover, resistances of the collector load resistors R23, R24 and of the emitter resistor R25 are changed.

Resistances for the 100-K specification and 10-K specification are determined, for example, as shown in Table 1 below.

TABLE 1

|  | 10-K specification | 100-K specification |
|---|---|---|
| R20 | 190 ohms | 200.0 ohms |
| R23 | 270 ohms | 155.8 ohms |
| R25 | 270 ohms | 155.8 ohms |
| R25 | 124 ohms | 67.8 ohms |
|  | without temperature compensation circuit | with temperature compensation circuit |

The number of elements of the circuit increases if two kinds of resistor elements are formed to have resistances for the 10-K specification and the 100-K specification. FIG. 4(a) is a diagram of a pattern of an embodiment of the resistor element. FIG. 4(b) is a section diagram along b—b' of FIG. 4(a). Each of the resistor elements shown in Table 1 above has two resistances. For instance, the resistor R20 has a length L2 to exhibit a resistance of 200 ohms for the 100-K specification. That is, contacts C1 and C2 of FIG. 4(a) are used. However, when it is to be used as a resistor element of 190 ohms to meet the 10-K specification, a contact C3 is formed at an intermediate point to correspond to the resistance; i.e., the resistor R20 is used as a resistor element of a length L1 corresponding to 190 ohms. That is, contacts C1 and C3 of FIG. 4(a) are used. In this case, the contact C2 is not formed.

As shown in FIG. 4(b), the resistor element is formed by a p+type resistance layer R provided in an n-type well region (n-well). The n-well is formed by introducing n-type impurities into an n-type epitaxial layer formed on a p-type silicon substrate (p-sub). Further, the element isolation regions L1 and L2 are composed of $SiO_2$, and are formed by the local oxidation of silicon (LOCOS) method. Thus, with the resistance layer R being constituted by a p+-type semiconductor region, it is allowed to easily change the resistance as described above. Symbols W1 and W2 denote aluminum wiring layers. When a portion denoted by C3 is to be utilized, the $SiO_2$ film is removed by etching from this portion, and the aluminum wirings are connected to the exposed p+-type resistance layer R. In this case, the contact C2 is not provided. This holds true even for other resistor elements R23, R24 and R25.

FIG. 4(c) is a diagram showing a layout of the case when the ECL output buffer circuit 601 of FIG. 3 has the 100-K specification, and FIG. 4(d) is a diagram showing a layout of the case when the ECL output circuit 601 of FIG. 3 has the 10-K specification. In the drawings, symbols C, B and E denote collector, base and emitter of the bipolar transistors (T22, T23, T24), respectively. In the drawings, furthermore, the same reference numerals as those of FIG. 3 denote the same portions. As described above, the resistors R23, R24 and R25 are realized in FIG. 4(c) by using contacts C1 and C2 to meet the 100-K specification and are realized in FIG. 4(d) by using contacts C1 and C3 to meet the 10-K specification. By employing the aforementioned constitution, a circuit having two kinds of output characteristics consisting of 10-K specification and 100-K specification is realized without substantially increasing the number of resistor elements but by simply changing the connections or, in other words, by simply changing the mask of wiring pattern. That is, the two output interfaces of 10-K specification and 100-K specification are selected by using wiring photomasks for the customers while commonly utilizing most of the circuitry.

Figure 5:
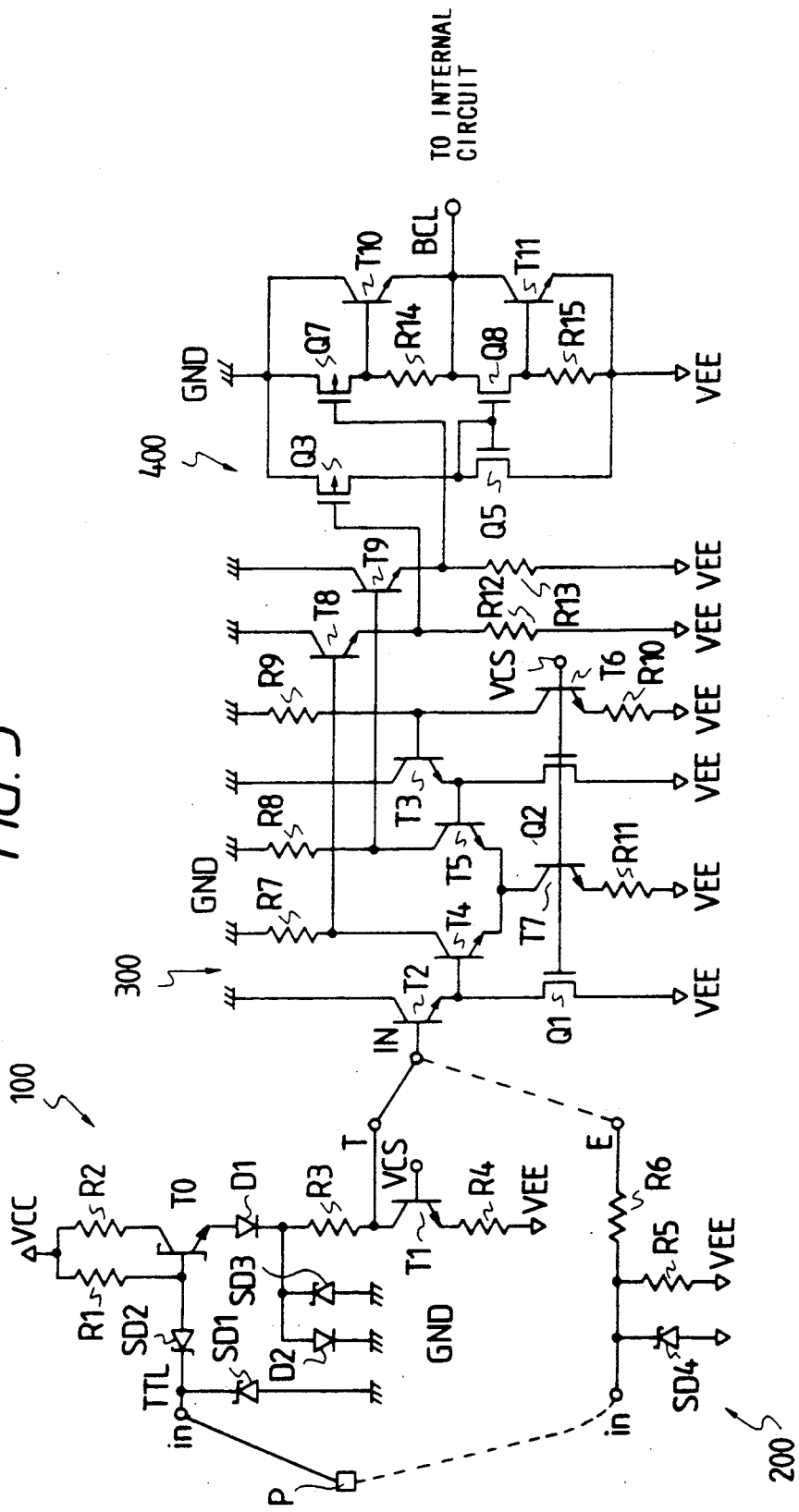
FIG. 5 is a circuit diagram illustrating another embodiment of the input interface unit.

FIG. 5 is a concrete circuit diagram of another embodiment of the input interface unit in the semiconductor integrated circuit device of the present invention.

In the semiconductor integrated circuit device of FIG. 1 which performs the TTL level/ECL level conversion and the ECL level/BCL level conversion, the circuits are formed in an increased number of stages in the input buffer unit and it is considered that the speed of operation decreases correspondingly. The number of stages of the circuits can be decreased if the totem pole-type push-pull output circuits T10, T11 are directly driven by the level amplifier stage 401 in the ECL level/BCL level converting circuit 400. That is, if mentioned in comparison with FIG. 1, the gate of the p-channel MOSFET Q7 of the CMOS structure constituting the driving stage is directly coupled to the emitter of the bipolar transistor T9 of the buffer circuit 300 instead of being coupled to the drain of the amplifier MOSFET Q4. Then, the n-channel MOSFET Q8 of the CMOS structure constituting the driving stage forms a current mirror together with the MOSFET Q5 but not together with the MOSFET Q6. Conversely speaking in regard to the MOSFETs Q7 and Q8, the action of the MOSFET Q7 may be carried out by the amplifier MOSFET Q4 and the action of the MOSFET Q8 may be carried out by the current mirror MOSFET Q6. Even when the transistors T10 and T11 are to be directly driven by the amplifier MOSFETs Q4 and Q6, resistors R14 and R15 are provided to drain the base charge of the transistors T10 and T11.

This constitution makes it possible to decrease the number of MOSFETs as well as to eliminate the driving stage. Therefore, the signal transfer path is shortened and the operation speed can be increased correspondingly. In particular, the TTL/ECL input interface of the semiconductor integrated circuit device tends to be of a multi-stage construction including the input TTL level converting unit 100, buffer circuit 300 and BCL level converting unit 400. Therefore, the level converting circuit 400 having a reduced number of circuit stages of FIG. 5 presents a great meaning.

Figure 6:
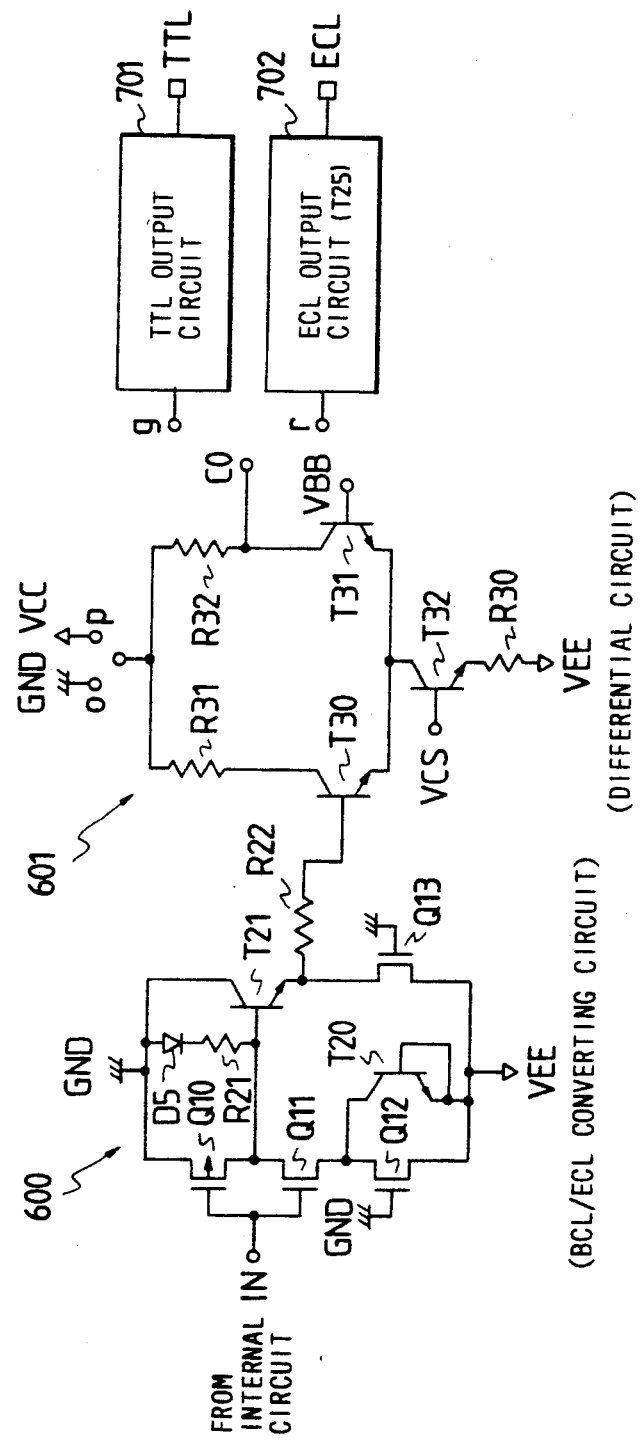
FIG. 6 is a circuit diagram illustrating another embodiment of the output interface unit.

FIG. 6 is a circuit diagram of an embodiment of the output circuit.

In the semiconductor integrated circuit device having input interfaces of the TTL/ECL levels, it becomes necessary to provide output interfaces of the TTL/ECL levels. This embodiment is constructed as described below such that the above two output interfaces can be selected by a simple constitution.

Though there is no particular limitation, the signal of the BCL level or the CMOS level that is formed by the internal gate circuit and that is to be output is converted into a signal of the ECL level by a BCL/ECL level converting circuit 600 which is the same as that of FIG. 3. The signal of the ECL level is fed to the base of the differential transistor T30. The reference voltage VBB is applied to the base of the differential transistor T31 that forms a pair with the differential transistor T30. Common emitters of the differential transistors T30 and T31 are connected to a constant-current source that consists of an emitter resistor R30 and a transistor T32 which receives a constant voltage VCS. The collectors of the differential transistors T30 and T31 are connected to load resistors R31 and R32, respectively. In order that both the ECL level output function and the TTL level output function can be selected, the ends of the resistors R31 and R32 on the side of the power source are selectively connected to the ground potential GND or to the positive power source voltage VCC. That is, when the resistors R31 and R32 are coupled to the connection point o, the ground potential GND is applied as an operation voltage and the differential transistor circuit forms an output signal of the ECL level with the ground potential as a reference. When the resistors R31 and R32 are connected to the connection point p, on the other hand, the positive power source voltage VCC is applied as an operation voltage, and the differential transistor circuit forms an output signal of the TTL level. With the constant current formed by the constant-current transistor T32 being allowed to flow into the resistors R31 and R32, the differential transistor circuit forms output signals of both the high level and low level. Therefore, with the power source voltage being simply switched as described above, the reference potential simply changes from the ground potential GND into the positive voltage VCC and the amplitude of the signal remains the same. Therefore, the resistors R31 and R32 are comprised of resistor elements shown in FIG. 4 and the contact portions are changed to increase the resistance such that, when connected to the voltage VCC, the amplitude of the signal acquires a large level to correspond to the TTL level. Instead, the resistance of the emitter resistor R30 may be changed in the same manner as described above, in order to form a signal of the TTL level. In this case, a large operation current flows into the differential circuit 601. Depending upon the output of ECL level and the output of TTL level, furthermore, the resistances of both the load resistor and the emitter resistor may be changed in order to form output signals of the levels corresponding thereto. Depending upon the selection of connection of the level converting unit, the output terminal CO of the level converting circuit 601 is connected to the input terminal g of a TTL output circuit 701 represented as a black box or is connected to the input terminal r of an ECL output circuit 702.

As described above, this embodiment is provided with the output circuit 701 for TTL level and the output circuit 702 for ECL level, and can be adapted to either the TTL output interface or the ECL output interface depending upon the user's specification. For instance, when the ECL output interface is desired, the load resistors R31 and R32 in the level converting unit are connected to the terminal o to form the output signal of the ECL level, and the output terminal CO is connected to the input terminal r of the ECL output circuit 702. When the TTL output interface is desired, the load resistors R31 and R32 in the level-converting unit 601 are connected to the terminal p to form an output signal of the TTL level, and the output terminal CO is connected to the input terminal g of the TTL output circuit 701.

FIG. 7 is a block diagram of the whole embodiment of the semiconductor integrated circuit device having the input interface shown in FIG. 1 and the output interface shown in FIG. 6.

In the semiconductor integrated circuit device IC of this embodiment are fabricated input interfaces EII and TII of ECL/TTL, internal gate circuit IGC that uses a negative voltage, and ECL/TTL output interfaces TOI and EOI. The TTL input interface TII is realized by the level converting circuit that converts the TTL level into the ECL level. The TTL output interface TOI is realized by the level converting circuit that converts a signal formed by the internal gate circuit IGC into a signal of the TTL level, and by the TTL output circuit. For instance, the level converting circuit and like circuits used in the input interface units TII, EII are realized by circuits 100, 200, 300, 400 shown in FIG. 1 or 5, and the level converting circuit and like circuits used in the output interface units TOI, EOI are realized by circuits 600, 601, 701, 702 shown in FIG. 6. Further, the ECL output circuit may be the one which makes it possible to select either the 10-K specification or the 100-K specification like that of the embodiment of FIG. 3. The above IC has a terminal Pvcc that receives a power source voltage of, for example, 5 volts, a terminal $P_{GND}$ that receives ground potential of, for example, 0 volt, a terminal $P_{VEE}$ that receives a negative power source voltage of, for example $-5.2$ or $-4.5$ volts, and input/output terminals Pi1, Pi2, Po1 and Po2. Though the terminals Pi1, Pi2, Po1 and Po2 are shown in FIG. 7 each in a number of one, such terminals are provided each in a number of several hundred in practice.

Though there is no particular limitation, the inner gate circuit IGC includes a plurality of BCL gate circuits. The gate portion of each inner gate is constituted by the CMOS circuit and the output portion is constituted by a bipolar transistor.

Figure 9:
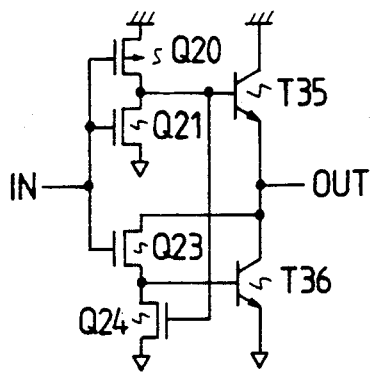
FIG. 9 is a circuit diagram illustrating an embodiment of a BCL circuit used for the internal gate circuit of the semiconductor integrated circuit device.

FIG. 9 is a circuit diagram of an embodiment of a basic circuit thereof. This embodiment deals with a unit gate circuit or, in other words, an inverter circuit. The CMOS unit drives an output transistor T35 of the high level side relying upon a CMOS inverter circuit consisting of a p-channel MOSFET Q20 for receiving the input signal IN and an n-channel MOSFET Q21. When the input signal IN has the low level, the p-channel MOSFET Q20 is turned on and a base current is supplied to the output transistor T35 to form an output signal OUT of the high level. When the input signal IN changes from the low level into the high level, the n-channel MOSFET Q21 is turned on, whereby the base charge of the output transistor T35 is drained and the transistor T35 is switched from on condition to off condition at a high speed.

Further, an n-channel MOSFET Q23 that receives the input signal IN is provided between the base and the collector of an output transistor T36 of the low level side to drive the transistor T36. That is, as the input signal IN changes from the low level into the high level, the MOSFET Q23 is turned on, whereby the output signal OUT of the high level is fed to the base of the transistor T36 to turn the transistor T36 on. Between the base and the emitter of the transistor T36 is provided an n-channel MOSFET Q24 that receives the output signal of the CMOS inverter circuit (Q20, Q21). When the input signal IN changes from the high level into the low level, therefore, the MOSFET Q24 is turned on by the output signal of the high level of the CMOS inverter circuit (Q20, Q21) whereby the base charge of the transistor T36 is drained at a high speed and the transistor T36 is turned off. Then, the transistor T35 is turned on by the output signal of the high level of the CMOS inverter circuit (Q20, Q21), and the output signal OUT changes from the low level to the high level.

Instead of being constituted as described above, the gate of the MOSFET Q24 may be so constituted as to supply the output signal OUT. In this case, the conductance of the MOSFET Q24 may be set to be smaller than the conductance of the MOSFET Q23 in order to maintain the base current when the transistor T36 is to be turned on.

When a NAND gate circuit is to be constituted, for example, a NAND gate circuit in which a p-channel MOSFET is connected in parallel and an n-channel MOSFET is connected in series, should be provided for the base of the transistor T35, and an n-channel MOSFET should be connected in series between the collector and the base of the transistor T36. When a NOR gate circuit is to be constituted, on the other hand, a NOR gate circuit in which a p-channel MOSFET is connected in series and an n-channel MOSFET is connected in parallel, should be provided for the base of the transistor T35, and an n-channel MOSFET should be connected in parallel between the collector and the base of the transistor T36. Even when the NAND gate circuit and the NOR gate circuit are to be constituted, the gate of the MOSFET Q24 that is provided between the base and the emitter of the transistor T36 to drain its base charge, should be connected to the base side of the transistor T35 or to the output terminal side provided its conductance is set to be small as described above, in the same manner as the inverter circuit shown in FIG. 9.

According to this embodiment in which the input and output interface circuits are fabricated as described above, it is allowed to select either the TTL input or output interface or the ECL input or output interface depending upon the specification of the user by simply changing the wiring mask. The ECL output interface makes it possible to select either 10-K specification or 100-K specification. Therefore, the user is allowed to have an increased degree of freedom for the interface and the manufacturer is allowed to increase the productivity of base chips.

In FIG. 7, the input interface needs not be uniformalized to either the ECL or the TTL. In a system in which the signals of the ECL level and the signals of the TTL level exist being mixed together, those input signals corresponding to the TTL level select the TTL input interface TII and those input signals corresponding to the ECL level select the ECL input interface EII. This also holds true even for selecting the output interface. That is, among a plurality of output signals, those output signals corresponding to the TTL level select the TTL output interface TOI and those output signals corresponding to the ECL level select the ECL output interface EOI.

In addition to being constituted by the aforementioned BCL circuit or the CMOS circuit, it needs not be pointed out that the internal gate circuit IGC may of course be constituted by the ECL gate circuit.

Figure 10:
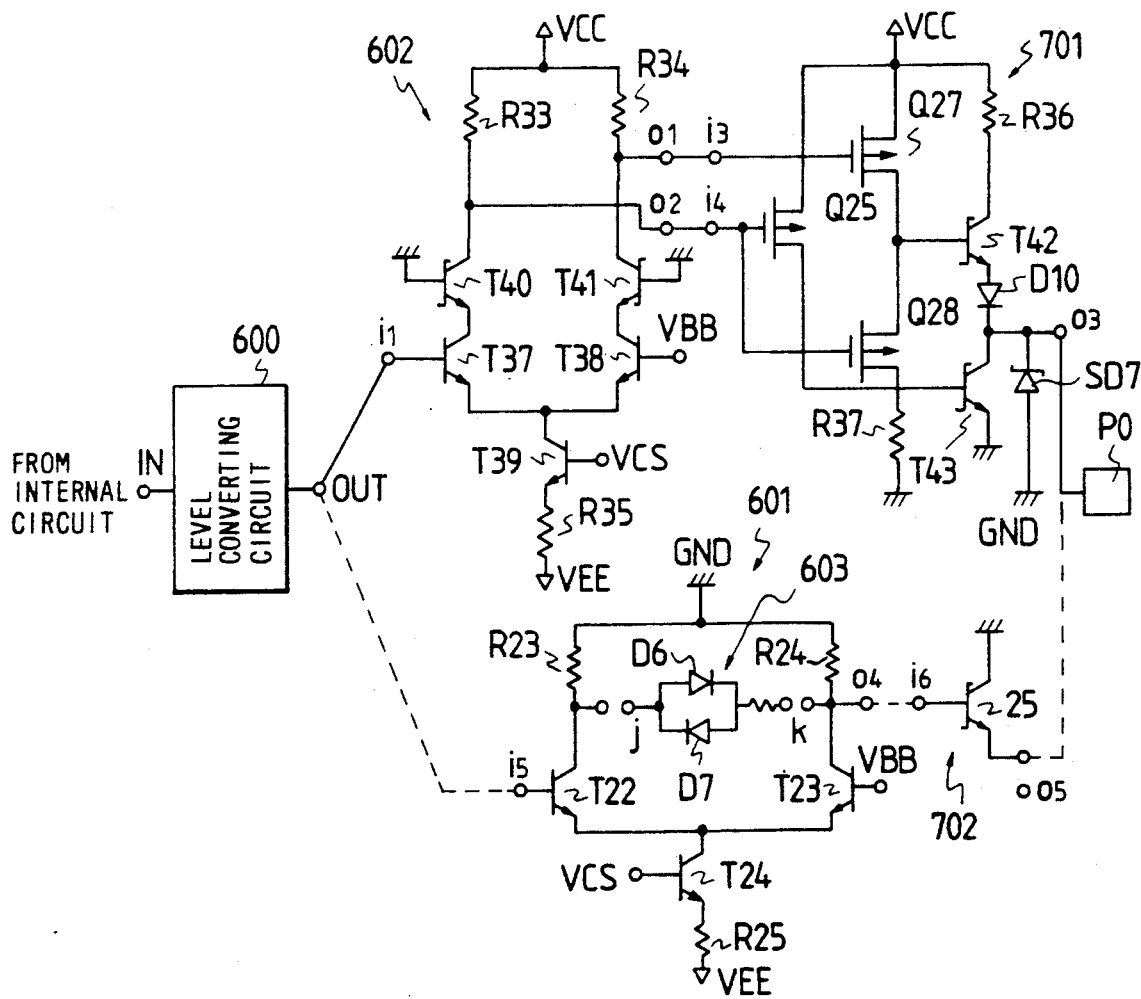
FIG. 10 is another circuit diagram of the output interface unit.

FIG. 10 illustrates another embodiment of the output buffer circuit for the TTL or ECL interface. Here, the level converting circuit 600, ECL differential output circuit 601, temperature compensation circuit 603 and ECL output circuit 702 were already described with reference to FIG. 3 and are not described here again in detail.

As shown in FIG. 10, the ECL/TTL level converting circuit 602 includes a pair of differential bipolar transistors T37 and T38, a current source (T39 and R35) coupled to a common emitter node of the transistors T37 and T38, Schottky bipolar transistors T40 and T41 whose emitters are connected to the collectors of the transistors T37 and T38, respectively, and load resistors R33 and R34 coupled between the power source terminal VCC and the collectors of the transistors T40 and T41. The current source includes a bipolar transistor T39 having a base that receives a constant voltage VCS, a collector coupled to the common emitter node of the transistors T37 and T38, and an emitter, and further includes an emitter resistor R35 coupled between the emitter of the transistor T39 and the negative power source terminal VEE. The transistors T40 and T1 are level clamp transistors whose bases are coupled to a ground voltage terminal GND. The above level converting circuit 602 receives through its input node il an input signal of the ECL level output from the output node out of the level converting circuit 600, and outputs complementary output signals of the TTL level (or the CMOS level) through its output nodes 01 and 02. Therefore, when the signal at the input node il has the ECL of high level greater than the reference potential VBB, a signal of the high level such as of the potential VCC and a signal of the low level such as of GND potential are output from the output nodes 01 and 02, respectively. When the signal at the input node il has the ECL level of low level smaller than the reference potential VBB, a signal of the low level such as of GND potential and a signal of the high level such as of VCC potential are output from the output nodes 01 and 02, respectively.

The TTL output circuit 701 has input nodes i3 and i4 coupled to the output nodes 01 and 02 of the level converting circuit 602, and has an output node 03 coupled to an external output terminal (pin) PO. The output stage of the TTL output circuit 701 includes Schottky-type output bipolar transistors T42 and T43, a resistor R36 connected between the collector of the transistor T42 and the power source terminal VCC, a level shift diode D10 connected between the emitter of the transistor T42 and the output node 03, and a Schottky diode SD7 that is coupled between the output node 03 and the power source terminal GND to work as an element for protecting the output transistor. The collector-emitter path of the transistor T43 is connected across the output node 03 and the power source terminal GND. The drive stage of the TTL output circuit 701 includes a p-channel MOSFET Q27 that has a gate coupled to the input node i3 and a source-drain path coupled across the power source terminal VCC and the base of the transistor T42, a p-channel MOSFET Q25 that has a gate coupled to the input node i4 and a source-drain path coupled across the power source terminal VCC and the base of the transistor T43, a p-channel MOSFET Q28 that has a gate coupled to the input node 04 and a source-drain path coupled across the base of the transistor T42 and the base of the transistor T43, and a resistor R37 coupled across the base of the transistor T43 and the power source terminal VEE. The MOSFETs Q25 and Q27 work to supply base charge to the transistors T43 and T42, respectively, and the MOSFET Q28 and the resistor R37 work to drain the base charge, respectively. Therefore, when the input nodes i3 and i4 assume the high level and the low level, respectively, the signal on the output node 03 assumes the TTL level of low level (e.g., 0.3 V). When the input nodes i3 and i4 assume the low level and the high level, on the other hand, the signal on the output node 03 assumes the TTL level of high level (e.g., 2.8 V).

The TTL output circuit 701 includes p-channel MOSFETs Q25, Q27 and Q28 but does not include n-channel MOSFETs as shown. That is, as shown in cross section of FIG. 4(b), the semiconductor gate array device that includes the TTL output circuit is formed by using a p-type semiconductor substrate (p-sub). Therefore, when the p-channel MOSFET is to be formed in the p-type semiconductor substrate (p-sub), the n-type epitaxial layer is formed on the substrate p-sub, the n-type well layer (n-well) is formed in the region where the p-channel MOSFET is to be formed, and a p-type layer is formed in the n-type well (n-well) to serve as source and drain region of the p-channel MOSFET. Here, the substrate (p-sub) is biased to a negative potential VEE (about −5.2 V or −4.5 ) and the n-well is biased to a positive potential VCC (+5 V). Therefore, the potential difference is 5 volts at the greatest between the channel portion (n-well) of the p-channel MOSFET and the source (drain) region, and there develops no problem in regard to the breakdown voltage. When the n-channel MOSFET is formed on the substrate p-sub, on the other hand, the p-type well layer (p-well) is formed in the n-type epitaxial layer on the substrate p-sub so as to reach the substrate p-sub, and the n-type layer is formed in the p-well layer to serve as source and drain regions of the n-channel MOSFET. Since the substrate p-sub is biased to a negative potential VEE as described above, the p-well layer is biased to a negative potential VEE, too. Therefore, a potential difference becomes as great as about 10 volts between the source (drain) region of the n-channel MOSFET and the channel portion (p-well), and there arises a problem of breakdown voltage with respect to the n-channel MOSFET.

Because of these reasons, the TTL output circuit 701 is constituted without using n-channel MOSFET.

In FIG. 10, when a signal produced by the internal circuit is to be output as an output signal of the TTL level through the terminal PO, the output node out of circuit 600 and the input node i1 of circuit 602 are coupled together, the output nodes 01, 02 of circuit 601 and the input nodes i3, i4 of circuit 701 are coupled together, and the output node 03 of circuit 701 and the external terminal PO are coupled together using, for example, aluminum wirings as indicated by solid lines. On the other hand, when a signal produced by the internal circuit is to be output as an output signal of the ECL level through the terminal PO, the output node out of circuit 600 and the input node i5 of circuit 601 are coupled together, the output node 04 of circuit 601 and the input node i6 of circuit 702 are coupled together, and the output node 02 of circuit 702 and the external terminal PO are coupled together using, for example, aluminum wirings as indicated by dotted lines.

Figure 11:
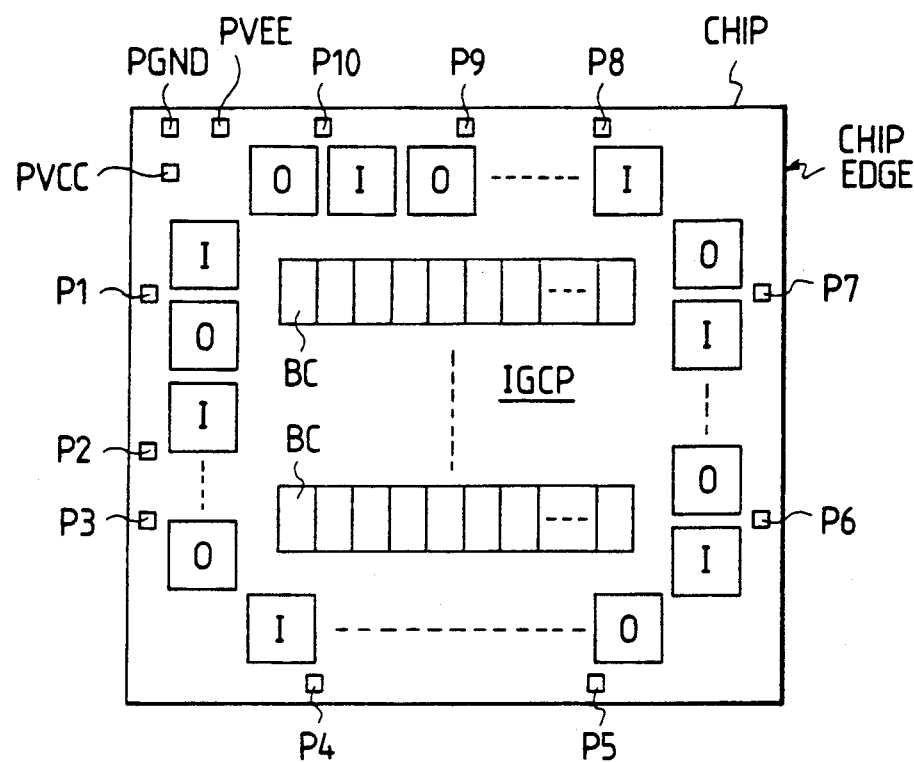
FIG. 11 is a diagram of chip layout of a gate array according to the present invention.

FIG. 11 is a diagram of layout of a bare chip of the semiconductor gate array. An internal gate circuit portion IGCP including a plurality of basic gate cells (BC) shown in FIG. 9 is arranged nearly at the central portion of the chip of a square shape. External terminals P1 to P10 for inputting and outputting signals, and external terminals PVCC, PGND and PVEE for supplying power source are arranged near the edges of the above chip. The input and output buffer-forming regions I and O are arranged between the external terminals P1 to P10 and the internal gate circuit portion. In the bare chip of the semiconductor gate array as shown, the input/output terminal P1 (P2 to P10) is provided in a number of one for each pair of input buffer unit I and output buffer unit 0.

Figure 12:
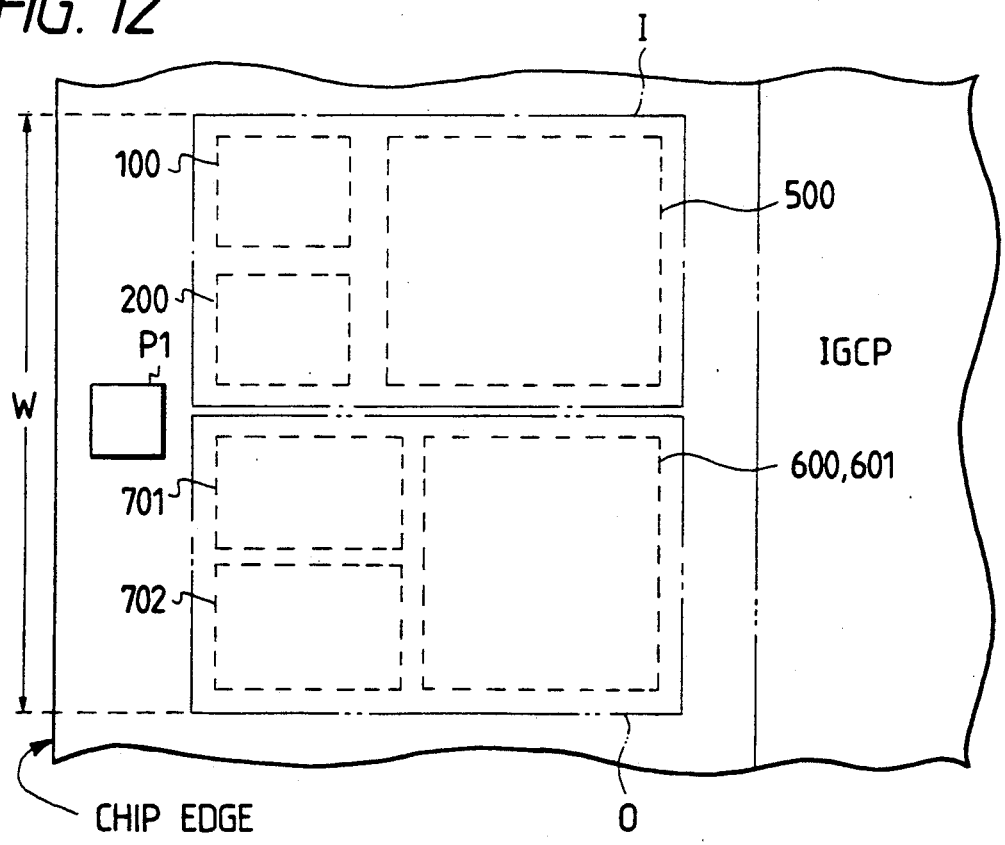
FIG. 12 is a diagram of layout of the input/output buffer unit of FIG. 11.

FIG. 12 is a diagram of layout showing the input and output buffer units 1 and 0 of FIG. 11 on an enlarged scale. In the input buffer unit I are arranged the TTL/ECL level converting input stage 100, ECL input stage 200 and common output stage 500 that are shown in FIG. 1. That is, the input stages 100 and 200 are arranged along the chip edge near the input/output terminal P1, and the output stage 500 is arranged between the internal gate circuit portion IGCP and the input stages 100 and 200. In the output buffer portion 0 are arranged the TTL output means 701, ECL output means 702 and common input stages 600, 601 that are shown in FIG. 6. That is, the TTL output stage 701 and the ECL output stage 702 are arranged along the chip edge near the input/output terminal P1, and the common input stages 600 and 601 are arranged between the internal gate circuit portion IGCP and the output stages 701 and 702.

By limiting the layout in the input and output buffer units I and O as described above, the input and output interfaces requested by the user can be effectively realized.

FIG. 12 shows the input/output terminal P1 in a relatively small size. In practice, however, the terminal P1 has a square shape whose side is nearly one-half the width W of the input and output buffers I, O. Therefore, the wiring from terminal P1 to input stage 1 00, the wiring from terminal P1 to input stage 200, the wiring from output stage 701 to terminal P1, and the wiring from output stage 702 to terminal P1, are all short.

In FIG. 12, furthermore, the forming regions 100, 200, 500, 701, 702, 600(601) are diagramed as black boxes. In practice, however, circuit elements (bipolar transistors, resistors, diodes, p-channel MOSFETs, n-channel MOSFETs) for forming the circuits are fabricated in these regions without being connected.

The above-mentioned basic gate cells BC can be formed in compliance with FIGS. 9(a), 9(b), 9(c) and 10(a) and 10(b) and the related description of U.S. Pat. No. 4,827,368 assigned to Hitachi, Ltd., issued on May 2, 1989.

Figure 13:
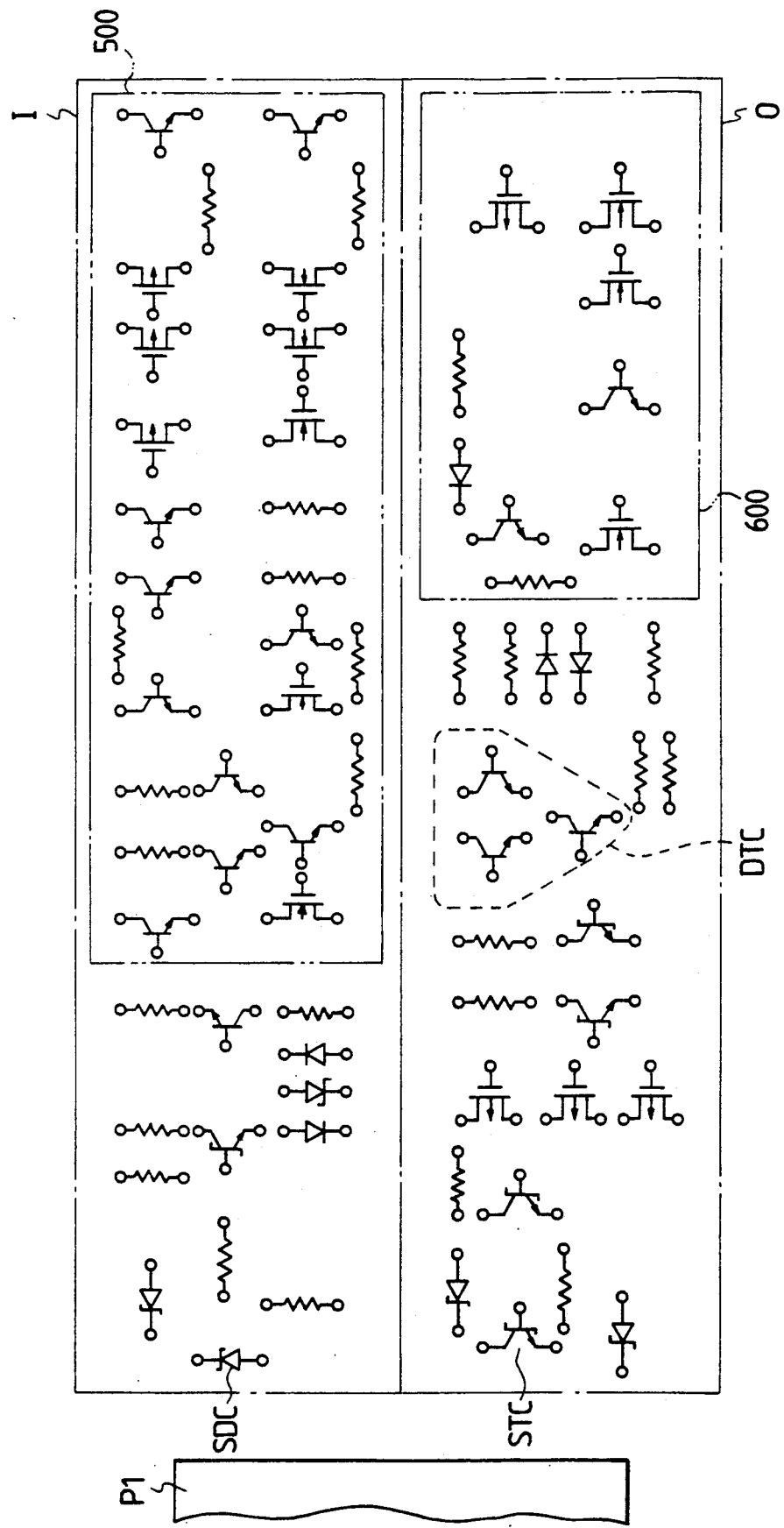
FIG. 13 is a diagram of another layout of the input/output buffer unit of FIG. 11.

FIG. 13 illustrates a further embodiment of the input and output buffer units I and O. The input buffer unit I includes a minimum number of circuit elements for efficiently forming the ECL or TTL input interface circuit shown in FIG. 1, and the output buffer unit 0 includes a minimum number of circuit elements for efficiently forming the ECL or TTL output interface circuit of FIG. 10.

Figure 14:
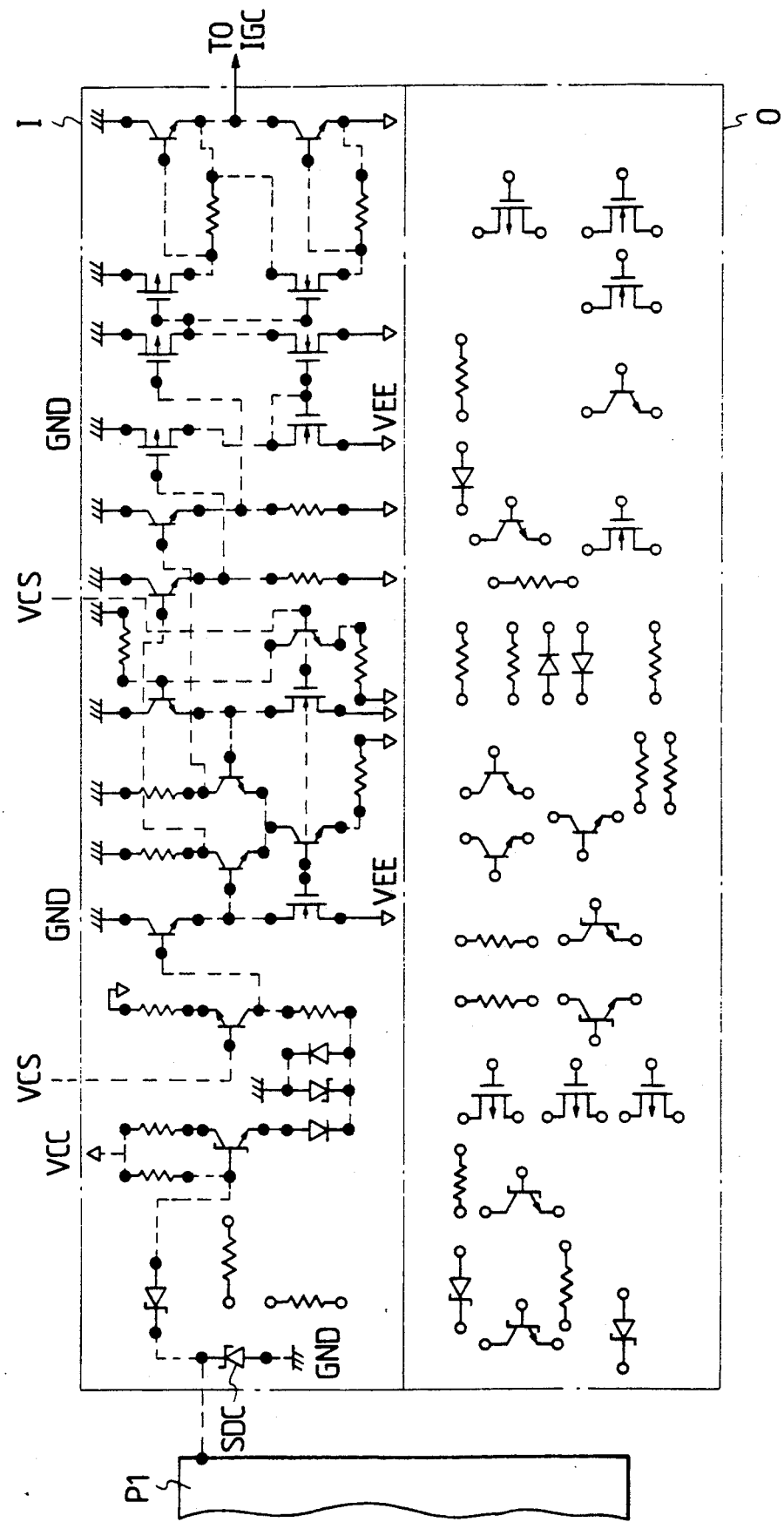
FIG. 14 is a diagram showing the connection of a TTL input interface formed in the input buffer unit of FIG. 13.
Figure 15:
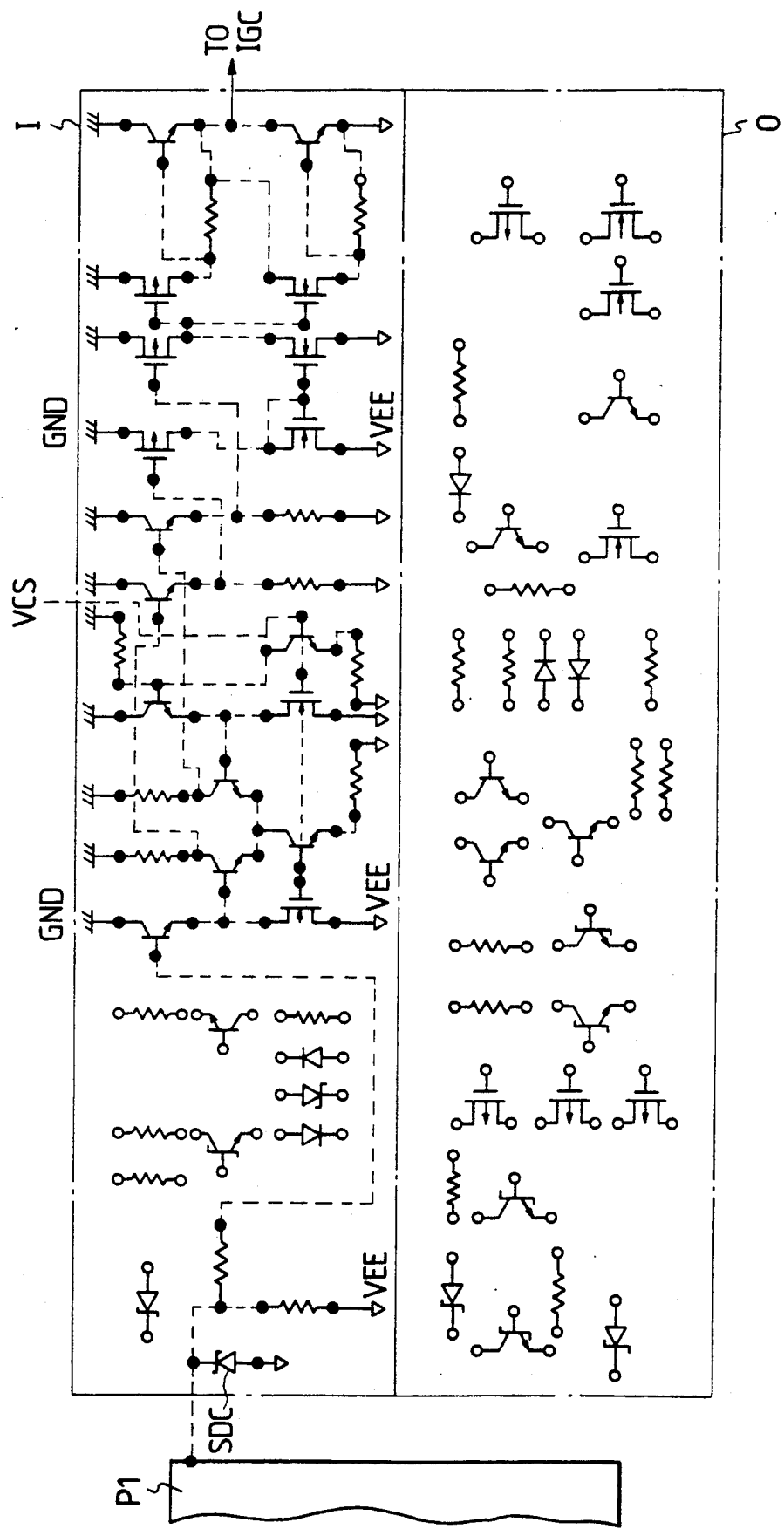
FIG. 15 is a diagram showing the connection of an ECL input interface formed in the input buffer unit of FIG. 13.

That is, in the ECL or TTL input interface circuit, the Schottky diode SD1 in the input stage 100 and the Schottky diode SD4 in the input stage 200 of FIG. 1 are formed as a single diode SDC in the input buffer unit, and this diode SDC is commonly used for the input interfaces of both ECL and TTL. Moreover, elements surrounded by a two-dot chain line 500 in FIG. 3 and circuit elements (R7 to R15, T2 to T11, Q1 to Q8) in the output stage 500 of FIG. 1 are commonly used for the input interfaces of both ECL and TTL. FIG. 14 shows the connection of circuit elements accomplished by using aluminum wirings or the like wirings as indicated by dotted lines in the input buffer unit I at the time of TTL input interface. FIG. 15 shows the connection of circuit elements accomplished by using aluminum wirings or the like wirings as indicated by dotted lines in the input buffer unit I at the time of ECL input interface.

In the output buffer unit 0 of FIG. 13, the output transistor T43 in the TTL output circuit 701 and the output transistor T25 in the ECL output circuit 702 of FIG. 10 are formed as a single output transistor STC in the output buffer unit 0, and this transistor STC is commonly used for the two interfaces. Furthermore, the transistors T37 to T39 in the converting circuit 602 and the transistors T22 to T24 in the circuit 601 of FIG. 10 are formed as a group of common transistors DTC surrounded by a dotted line in the output buffer 0 of FIG. 13, and this group of common transistors DTC is commonly used for the two interfaces. Moreover, elements surrounded by a two-dot chain line 600 of FIG. 13 and circuit elements (R21, R22, D5, T20, T21, Q10 to Q13) of the level converting circuit 600 (same as the circuit 600 of FIG. 6) of FIG. 10, are commonly used for the two interfaces.

Figure 16:
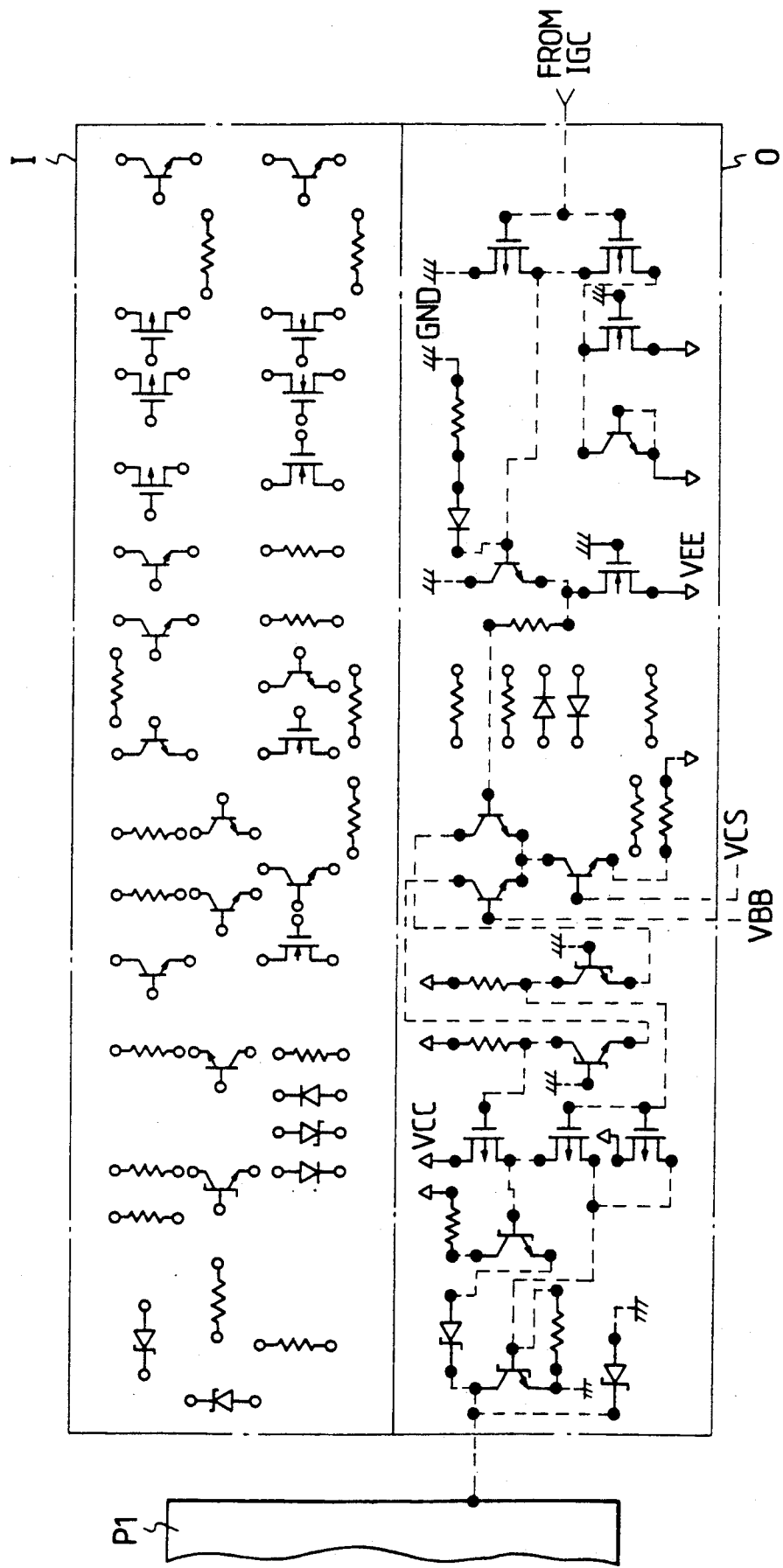
FIG. 16 is a diagram showing the connection of a TTL output interface formed in the output buffer unit of FIG. 13.
Figure 17:
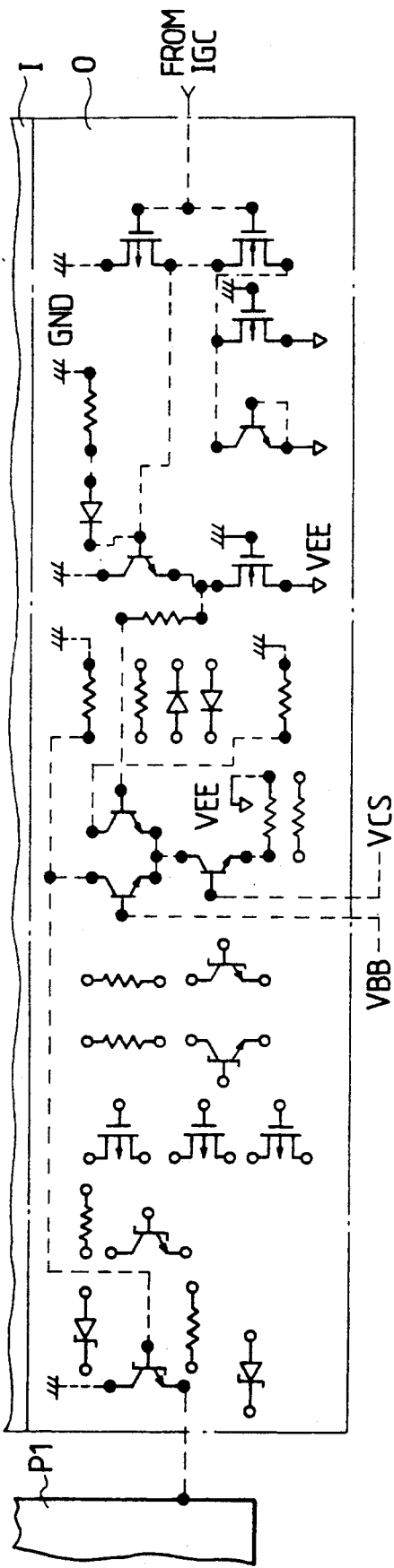
FIG. 17 is a diagram showing the connection of an ECL output interface of 10-K specification formed in the output buffer unit of FIG. 13.
Figure 18:
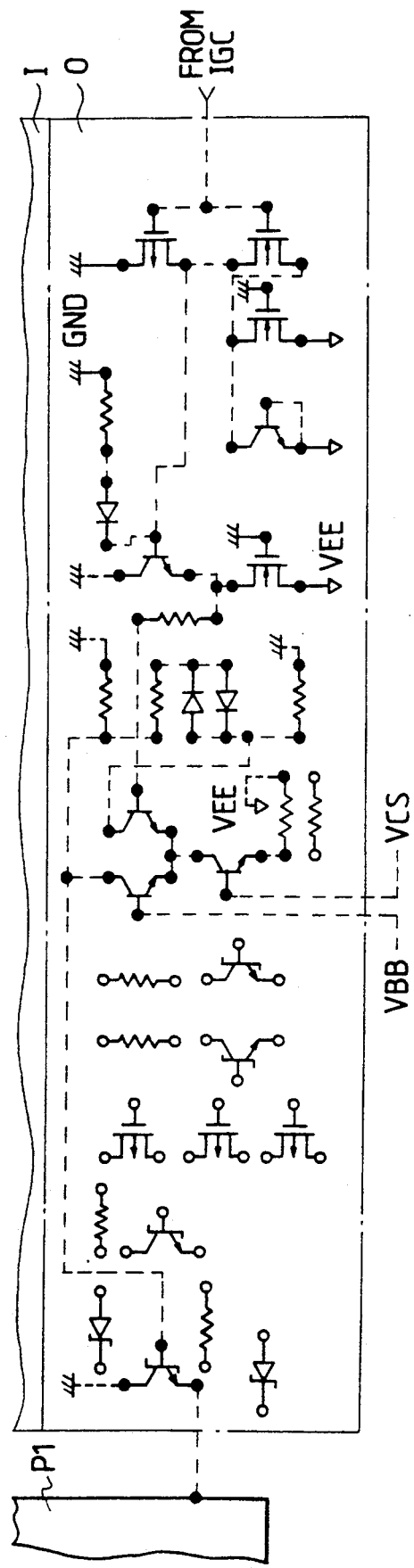
FIG. 18 is a diagram showing the connection of an ECL output interface of 100-K specification formed in the output buffer unit of FIG. 13.

FIG. 16 shows the connection of circuit elements in the output buffer unit 0 in the case of the TTL output interface, FIG. 17 shows the connection of circuit elements in the output buffer unit 0 in the case of ECL output interface of 10-K specification, and FIG. 18 shows the connection of circuit elements in the output buffer unit 0 in the case of ECL output interface of 100-K specification. Dotted lines represent aluminum wirings like in FIGS. 14 and 15.

Figure 8:
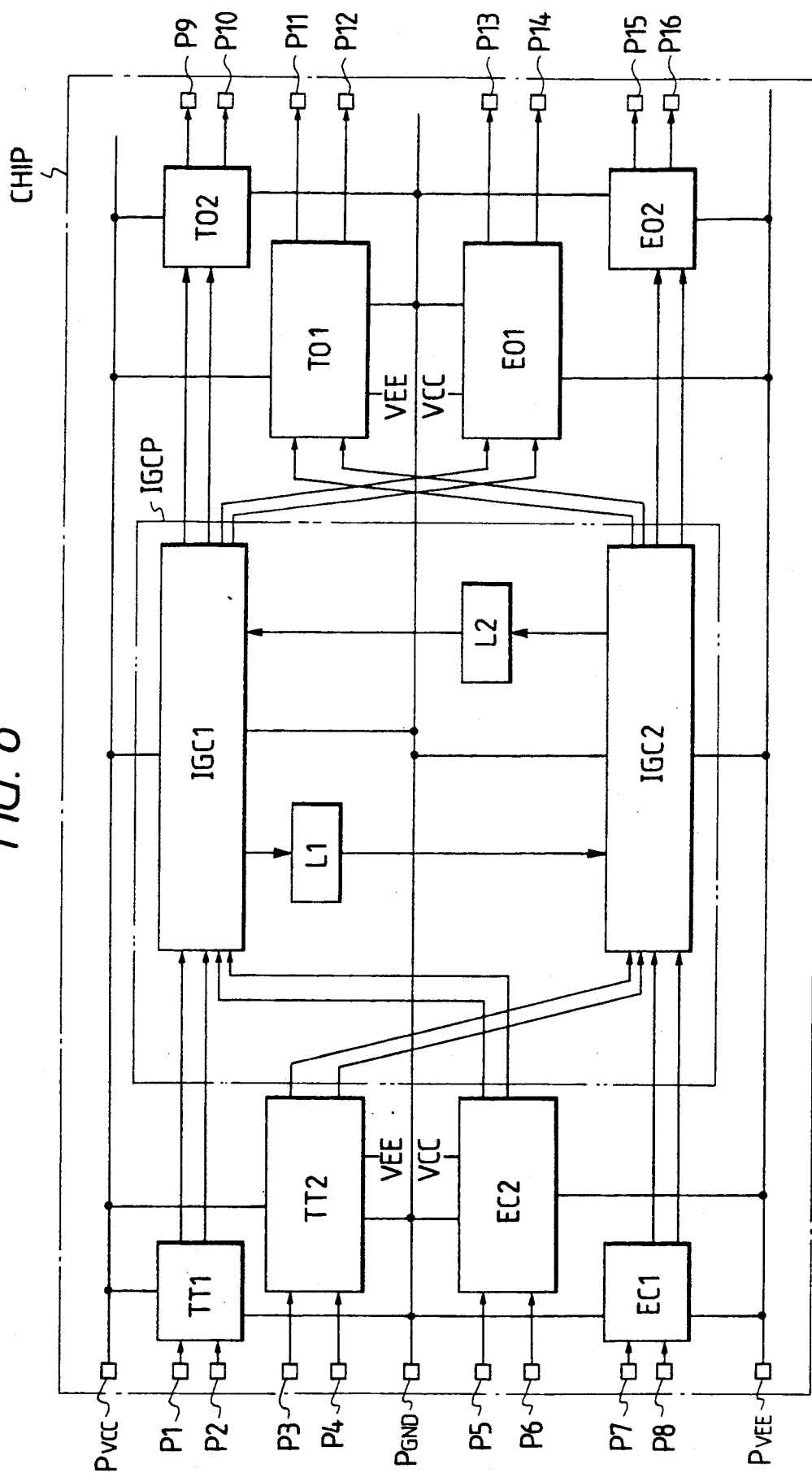
FIG. 8 is a block diagram of another embodiment of the semiconductor integrated circuit device according to the present invention.

FIG. 8 is a block diagram of a further embodiment of the semiconductor integrated gate array circuit device according to the present invention. This embodiment deals with the semiconductor gate array containing both the TTL input interface and the ECL input interface, and wherein two kinds of internal gate circuits are provided to effectively utilize the power source voltage and to increase the speed of operation. That is, the internal gate circuit portion IGCP includes two gate circuits, i.e., a first internal gate circuit IGC1 provided between the positive power source voltage VCC and the ground voltage GND, and a second internal gate circuit IGC2 provided between the ground voltage GND and the negative power source voltage VEE. The TTL input interface includes a first TTL input circuit TT1 that supplies an output signal of the TTL level (or the CMOS level) to the first internal gate circuit IGC1 upon receipt of an input signal of the TTL level (H=3.0 V, L=0 V), and a second TTL input circuit TT2 that supplies an output signal of the ECL level to the second internal gate circuit IGC2 upon receipt of an input signal of the TTL level. The circuit TT1 is constituted by a general TTL circuit or by the input circuit of FIG. 25. The circuit TT2 is constituted by using the circuits 100 and 300 shown in FIG. 5. The ECL input interface includes a first ECL input circuit EC1 that supplies an output signal of the ECL level to the second internal gate circuit IGC2 upon receipt of an input signal of the ECL level (H=−0.9 V, L=−1.7 V), and a second ECL input circuit EC2 that supplies an output signal of the TTL level or the CMOS level to the first internal gate circuit IGC1 upon receipt of an input signal of the ECL level. The circuit EC1 is formed by using the circuits 200 and 300 of FIG. 5, and the circuit EC2 is formed by using the circuits 200, 300 and 400 of FIG. 5. The ECL interface includes a first ECL output circuit EO1 that converts an output signal formed by the first internal gate circuit IGC1 into a signal of the ECL level and outputs it, and a second ECL output circuit EO2 that receives the output signal of the ECL level output from the second internal gate circuit IGC2 and that forms an external output signal of the ECL level (H=−0.9 V, L=−1.8 V). The circuit EO1 is formed by using the circuit 100 of FIG. 1 and the circuits 601 and 702 of FIG. 3. The circuit EO2 is constituted by using the circuits 601 and 702 of FIG. 3. The TTL output interface includes a first TTL output circuit TO1 converts an output signal formed by the second internal gate circuit IGC2 into a signal of the TTL level and outputs it, and a second TTL output circuit TO2 that receives the output signal of the TTL level or the CMOS level output from the first internal gate circuit IGC1 and forms an external output signal of the TTL level (H=2.8 V, L=0.42 ). The circuit EO1 is formed using the circuits 602 and 702 of FIG. 10. The circuit TO2 is constituted by the circuit 701 of FIG. 10 but in which the transistors Q25 and Q28 are replaced by the n-channel MOSFETs and the input nodes i3 and i4 are connected together.

In obtaining logics of TTL input signal and ECL input signal in the internal gate circuit portion, selection of the internal gate circuit IGC1 or IGC2 to include a logic circuit therein to obtain logics plays an important role for determining the speed of operation. This is because, the input level of one side is necessarily converted into the other logic level, and the transmission speed of the signal becomes slow accompanying the level conversion operation. For example, when the critical path extends from the input of TTL input signal up to the logic block that includes a flip-flop which is to be formed in the internal gate circuit portion IGCP, the logic block is formed by using the internal gate circuit IGC2. Conversely, when the critical path extends from the input of ECL input signal up to the logic block that includes a flip-flop circuit formed in the internal gate circuit portion IGCP, the logic block is formed by using the internal gate circuit IGC2. When the TTL input signal is processed in the inner portion and is output as a TTL signal or, in other words, when the logic from the input to the output is closed in the TTL system, the circuit block for processing the signals is comprised of the inner gate circuit IGC1. When the ECL input signal is processed in the inner portion and is output as an ECL signal or, in other words, when the logic from the input to the output is closed in the ECL system, the circuit block for processing the signals is comprised of the internal gate circuit IGC2.

In addition to using the TTL gate and/or the ECL gate, the internal gate circuit portion IGCP may be constituted by the BCL circuit. That is, the BCL circuit provided in the internal gate circuit IGC1 should be operated between the positive power source voltage VCC and GND, and the BCL circuit in the internal gate circuit IGC2 should be operated between GND and the negative power source voltage VEE as in the aforementioned embodiment.

Figure 25:
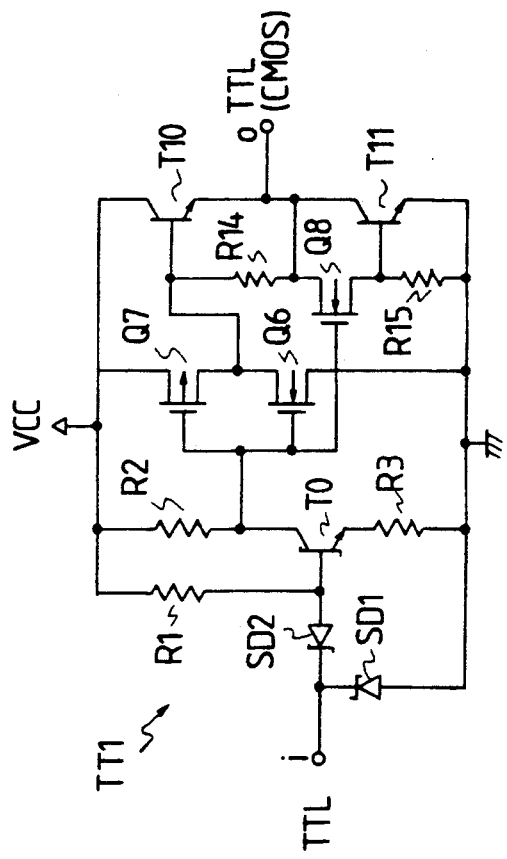
FIG. 25 is a diagram of a TTL input circuit of FIG. 8.

The following description is concerned with FIG. 25 that appeared already.

The TTL input circuit TT1 is formed in the input buffer I using circuit elements of a portion of the circuit 100 and of a portion of the circuit 400 of FIG. 1.

When the input node i assumes the TTL level of high level, a base current flows into the base of a Schottky transistor TO via a resistor R1, whereby the transistor TO is rendered conductive and the collector potential of the transistor TO drops into the low level through a resistor R2.Therefore, a p-channel MOSFET Q7 is rendered conductive, and n-channel MOSFETs Q6 and Q8 are rendered nonconductive. Then, an output transistor T10 is rendered conductive and an output transistor T11 is rendered nonconductive. Therefore, the output node o assumes the high level such as VCC.

Conversely, when the input node i assumes the TTL level of low level, a Schottky diode SD2 is rendered conductive and the Schottky transistor TO is rendered nonconductive. Therefore, the collector potential of the transistor TO assumes the high level, the n-channel MOSFETs Q6 and Q8 are rendered conductive, and the p-channel MOSFET Q7 is rendered nonconductive. Then, the transistor T10 is rendered nonconductive and the transistor T11 conductive. As a result, the output node o assumes the low level such as GND.

Described below is another feature of the gate array of FIG. 8. That is, the internal gate circuit portion IGCP is provided with a first level converting circuit L1 that converts the output signal of the TTL or CMOS level from the internal gate circuit IGC1 into a signal of the ECL level and feeds it to the internal gate circuit IGC2, and a second level converting circuit L2 which converts an output signal of the ECL level output from the internal gate circuit IGC2 into a signal of the TTL level or the CMOS level and feeds it to the internal gate circuit IGC1. As required, the level conversion from ECL into TTL or from TTL into ECL is carried out in the internal gate circuit portion IGCP. Therefore, increased kinds of circuit systems can be formed in the internal gate circuit portion IGCP to extend general applicability of the gate array.

Figure 19:
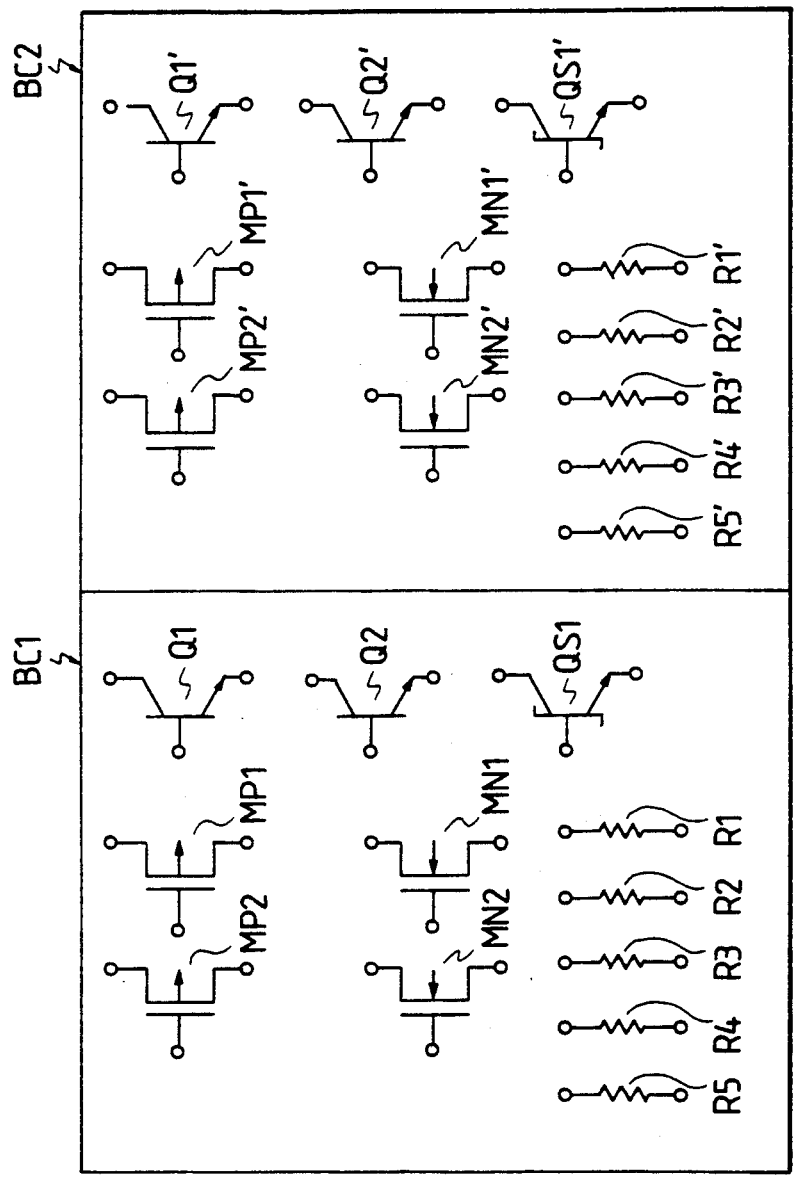
FIG. 19 is a diagram of layout of basic gate cells used in FIG. 8.

The level converting circuits L1 and L2 are formed by using basic gate cells BC in the internal gate circuit portion IGCP. FIG. 19 is a diagram showing the layout of the basic gate cells BC, and wherein two basic gate cells BC1 and BC2 are shown. The above cells BC1 and BC2 include the same circuit elements. That is, the cell BC1 includes p-MOSFETs MP1 and MP2, n-MOSFETs MN1 and MN2, resistors R1 to R5, bipolar transistors Q1 and Q2, and a Schottky bipolar transistor QS1. Circuit elements in the cell BC2 are denoted by the same symbols as those of the cell BC1 but having the final superscript sign ('). For instance, MP1' denotes the same element as MP1.

FIGS. 20 to 23 illustrate various circuits formed by using the cell BC1 (BC2).

Figure 20:
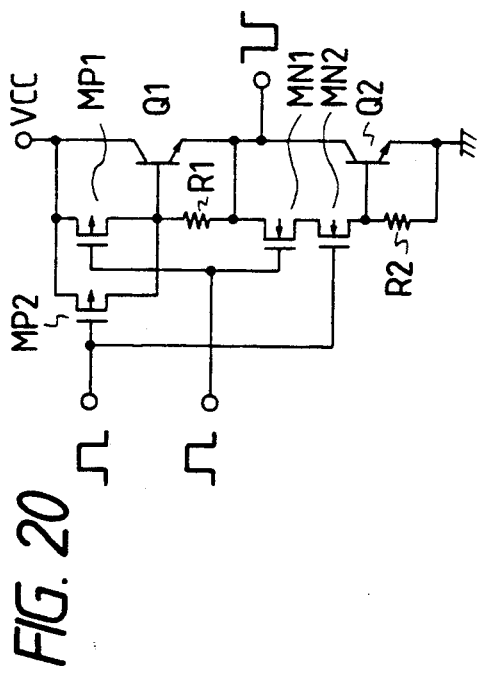
FIG. 20 is a diagram of two-input NAND circuit formed by using the basic cells of FIG. 19.

FIG. 20 shows a two-input NAND circuit formed by connecting circuit elements in the cell BC1. The operation of the two-input NAND circuit can be easily understood by a person with ordinary skill and is not described here. The two-input NAND circuit is used as a circuit in the first input gate circuit IGC1, and receives input signals of the CMOS level and produces an output signal of the CMOS level.

Figure 21:
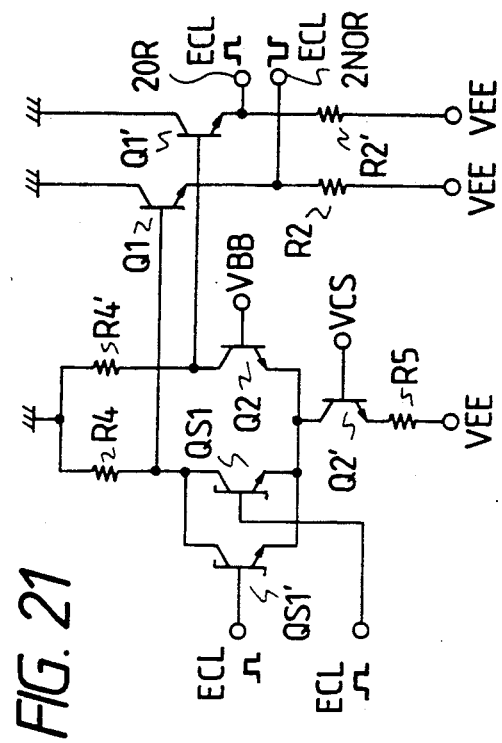
FIG. 21 is a diagram of ECL circuit formed by using basic cells of FIG. 19.

FIG. 21 shows an ECL circuit formed by coupling the circuit elements of the cells BC1 and BC2. The ECL circuit is used as a circuit in the second internal gate circuit IGC2. The operation of the ECL circuit is the same as that of a general ECL circuit and is not described here.

Figure 22:
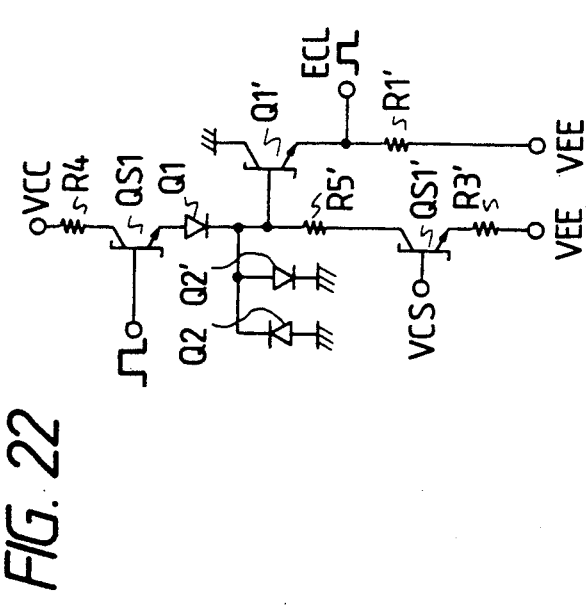
FIG. 22 is a diagram of a TTL/ECL level converting circuit formed by using the basic cells of FIG. 19.

FIG. 22 shows a level converting circuit L1 formed by connecting the circuit elements of the cells BC1 and BC2. The operation of the circuit is nearly the same as that of the circuit 100 of FIG. 1.

Figure 23:
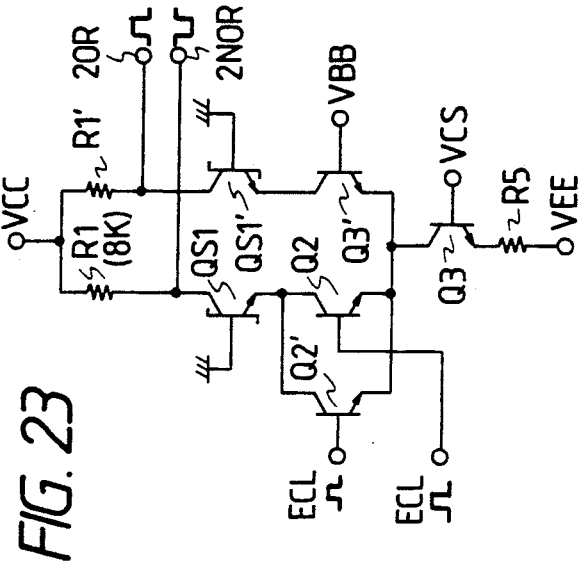
FIG. 23 is a diagram of an ECL/TTL level converting circuit formed by using the basic cells of FIG. 19.

FIG. 23 shows a level converting circuit L2 formed by connecting the circuit elements of the cells BC1 and BC2. The operation of the circuit is nearly the same as that of the circuit 602 of FIG. 10.

A variety of circuits can be formed as shown in FIGS. 20 to 23 by using the cell BC1 (BC2) that is shown in FIG. 19, contributing to extending the general applicability of the gate array.

Figure 24:
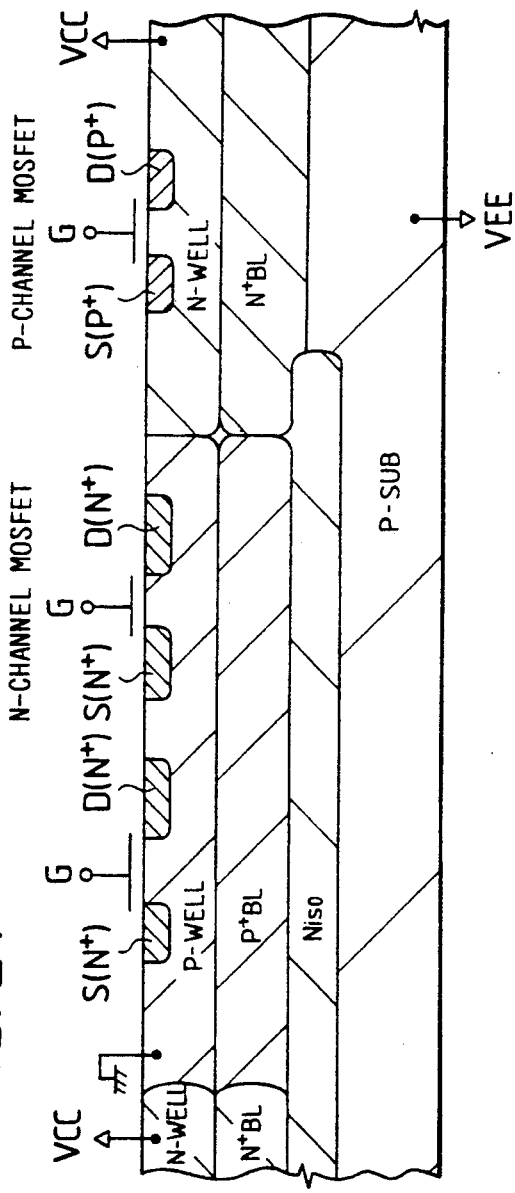
FIG. 24 is a section view of a device concerned with n-channel MOSFETs.

FIG. 24 is a section view of a device related to p-channel and n-channel MOSFETs for utilizing the circuits of FIGS. 8 and 18 to 23.

In the section view of this device, attention should be given to that the p-well layer and p+-type buried layer (p+BL) in which are formed the n+-type source region S and the n+-type drain region D of n-channel MOSFET (e.g., Q6, Q8 of FIG. 18 or MN1, MN2 of FIG. 20) are electrically isolated from the p-type substrate which is biased to the potential VEE by the n-well layer, n+-type buried layer (n+BL) and n-type isolation layer (NiSO) biased to the potential VCC. Therefore, the bias potential of the p-well layer and p+BL layer constituting the channel of n-channel MOSFET can be set to GND potential, and there develops no problem of breakdown voltage. Here, the p+-type source region S and the p+-type drain region D of the p-channel MOSFET may be formed in the n-well layer as shown. Though there is no section view of the bipolar transistor, the npn bipolar transistor has the p-type base region formed in the n-well layer, has the n+-type emitter region formed in the p-type base region, and has the collector region formed in the n-well layer and in the n+BL layer.

When the input and output interfaces of ECL and TTL are included in a mixed manner as in the semiconductor integrated circuit device of this embodiment, the level converting circuit is used as in the aforementioned embodiment to simplify the circuit. Further, the circuit can be selected by simply changing the wiring mask.

Described below are the actions and effects exhibited by the aforementioned embodiments.

(1) There are formed an input stage which converts an input signal of the TTL level into a signal of the ECL level, and an input stage of the ECL circuit, which are then connected to the through buffer that receives the signals of the ECL level by setting the wiring mask depending upon the input specification. Therefore, the circuit is simplified and increased degree of freedom is given to the design.

(2) Contacts are formed at both ends and at an intermediate portion of each resistor element to obtain two kinds of resistances. Resistances of the load resistor connected to the collector of the differential transistor that receives the output signal of the ECL level, the emitter resistor of the constant current source provided for the common emitter of the differential transistor, and the resistor element that determines temperature characteristics of a power source circuit that forms a constant voltage supplied to the constant-current source, are set depending upon the 10-K specification or the 100-K specification. Further, the temperature compensation circuit corresponding to the 100-K specification is connected between the collectors of the differential transistors, thereby to realize two kinds of output interfaces without substantially increasing the number of elements.

(3) The collector load resistor of the differential transistor that receives the ECL signal and the reference voltage corresponding thereto, is connected to the ground potential that corresponds to the ECL output circuit or to the positive power source voltage that corresponds to the TTL output circuit depending upon the output specification. The ECL output circuit or the TTL output circuit is selectively connected depending upon the output signal of the level converting circuit, in order to realize two kinds of output interfaces in simplified constitution.

(4) Totem pole-type push-pull output transistors connected in cascade are driven by a pair of p-channel MOSFETs that are connected in opposite phases relative to each other and that receive signals of the ECL level, by an n-channel MOSFET in the current mirror form that receives the drain output from one of said pair of p-channel MOSFETs, by an n-channel output MOSFET of the current mirror form, and by the other p-channel MOSFET. Therefore, the driving stage and the level converting stage are formed in common, contributing to decreasing the number of elements and increasing the speed of operation.

(5) Of the first internal gate circuit that receives an input signal which has passed through the TTL input buffer and/or a signal of the TTL level converted from a signal of the ECL level by a level converting circuit and the second internal gate circuit that receives an input signal which has passed through the ECL input buffer and/or a signal of the ECL level converted from a signal of the TTL level of the input side level, the internal logic circuit that receives both the TTL input signal and the ECL input signal is so formed as to constitute the first internal gate when the TTL input signal forms the critical path, and is so formed as to constitute the second internal gate when the ECL input signal forms the critical path. Therefore, the power source voltage is effectively utilized and the speed of operation increases.

(6) Owing to the matters mentioned in (1) to (5) above, semiconductor integrated circuit devices having a variety of input interfaces are formed by simply changing the wiring mask. That is, the semiconductor integrated circuit devices are efficiently formed in small amounts but in a variety of kinds.

In the foregoing was concretely described the invention accomplished by the present inventors by way of embodiments. The present invention, however, is in no way limited to the aforementioned embodiments only but can be modified in a variety of other ways without departing from the gist of the invention. For instance, in addition to being used as the circuit blocks of the semiconductor integrated circuit devices shown in FIG. 7 and 8, the circuits of the embodiments of FIGS. 1 to 6 can be widely used as independent circuits. For example, the output interface circuit that permits the selection of either the 10-K specification or the 100-K specification shown in FIG. 3 can be utilized for various semiconductor integrated circuit devices of the ECL structure and for the output portions of bipolar RAMs. The ECL/BCL level converting circuit shown in FIG. 5 can be extensively utilized for various semiconductor integrated circuit devices that have a circuit for converting the ECL level into the BCL level such as static RAMs of the ECL-compatible Bi-CMOS structure, in addition to being used for the gate arrays.

The present invention can be extensively utilized for the semiconductor integrated circuit devices that contain TTL, ECL and BCL circuits.

Briefly described below are the effects obtained by a representative example among the inventions disclosed in this application. That is, there are formed an input stage which converts an input signal of the TTL level into a signal of the ECL level, and an input stage of the ECL circuit. Further, contacts are formed at both ends and at an intermediate portion of each resistor element to obtain two kinds of resistances. There are further formed load resistors for the collectors of differential transistors that receive output signals of the ECL level, an emitter resistor of a constant-current source provided for the common emitters of the differential transistors, a resistor element that determines temperature characteristics of the power source circuit which forms a constant voltage supplied to the constant-current source, and collector load resistors of the differential transistors that receive an ECL signal and a reference voltage corresponding thereto. This makes it possible to realize a variety of input/output interfaces that meet the input specification and output specification by changing the wiring. Furthermore, the level amplifying stage that converts the signal of the ECL level into a signal of the CMOS level and the driving stage of the totem pole-type push-pull output transistors are formed in common to simplify the circuit and to increase the speed of operation. The semiconductor integrated circuit device which contains TTL and ECL in a mixed manner operates at high speeds if the internal gate is selected depending upon the critical path.

What is claimed is:

1. A semiconductor integrated circuit device comprising:

a first input stage that converts input signals of a TTL level into first signals of an ECL level;

a second input stage that receives input signals of an ECL level and provides second signals of an ECL level;

a through buffer that receives said first or second signals of the ECL level;

a level converting circuit that receives output signals of the through buffer and converts them into signals of a CMOS level; and a logic circuit operated by said signals of the CMOS level, wherein said first and second input stages are selectively connected to the through buffer.

2. A semiconductor integrated circuit device comprising:

differentially connected transistors coupled to receive ECL level produced signals;

load resistors connected to the collectors of the differential transistors;

a current source which is connected to the common emitters of said differential transistors, and which includes a transistor that receives a predetermined voltage, and an emitter resistor;

a temperature compensation circuit coupled across the collectors of the differential transistors; and a voltage generating circuit for forming said predetermined voltage that is to be applied to said current source, wherein said voltage generating circuit includes a resistor for determining a temperature characteristic of said voltage generating circuit, and wherein ECL output signals of a 10-K specification or 100-K specification are formed in accordance with setting a resistance value of the resistor of the voltage generating circuit, setting resistance values of the load resistors and setting a resistance value of the emitter resistor of the current source, and by either connecting or not connecting the temperature compensation circuit across the collectors of the differential transistors.

3. A semiconductor integrated circuit device according to claim 2, wherein each of said resistor, said load resistors and said emitter resistor is commonly formed for either the 10-K specification or the 100-K specification, and a pair of contacts are obtained from both ends of each of said resistor, said load resistors and said emitter resistor when a large resistance value is to be obtained and when a small resistance value is to be obtained, one of the pair of contacts is obtained from an intermediate point indicative of the small resistance value.

4. A semiconductor integrated circuit device comprising:

a level converting circuit having differentially connected transistors that receive an ECL signal and a reference voltage at bases thereof, and load resistors connected between respective collectors of the differential transistors and a ground potential node or a positive power source voltage node, depending upon an output specification requirement of the device wherein said level converting circuit has an output node for generating an ECL level type output signal when said load resistors are connected to said ground potential node and a TTL level type output signal when said load resistors are connected to said positive power source voltage node; and an ECL output circuit or a TTL output circuit that is selectively connected to the output node of said level converting circuit depending upon the output signal of said level converting circuit, wherein said ECL output circuit is coupled to the output node of said level converting circuit when the output signal of said level converting circuit has the ECL level requirement and said TTL output circuit is coupled to the output node of said level converting circuit when the output signal of said level converting circuit has the TTL level requirement.

5. A semiconductor integrated circuit device comprising:

an input stage that converts input signals of a TTL level into signals of an ECL level;

an input stage of the ECL level;

a through buffer based on the ECL circuit being connected to either one of the two input stages depending on an input specification requirement of the device;

a first level converting circuit that receives output signals of the through buffer and converts them into signals of the CMOS level;

an internal logic circuit coupled to said first level converting circuit and operated by said signals of CMOS level;

a second level converting circuit coupled to said internal logic circuit for converting output signals thereof of the CMOS level into a signal of the ECL level;

a third level converting circuit, coupled to said second level converting circuit, including differentially connected transistors that receive the level converted ECL signals and a reference voltage at bases thereof and load resistors connected between respective collectors of the differential transistors and a ground potential node or a positive power source voltage node depending upon an output specification requirement of the device, wherein said third level converting circuit has an output node for generating an ECL level type output signal when said load resistors are connected to said ground potential node and a TTL level type output signal when said load resistors are connected to said positive power source voltage node; and an ECL output circuit or a TTL output circuit that is selectively connected to the output node of said third level converting circuit depending upon the output signal of said third level converting circuit, wherein said ECL output circuit is coupled to the output node of said third level converting circuit when the output signal of said third level converting circuit has the ECL level requirement and said TTL output circuit is coupled to the output node of said third level converting circuit when the output signal of said third level converting circuit has the TTL level requirement.

6. A semiconductor integrated circuit device comprising a level converting circuit which includes:

a pair of p-channel MOSFETs that receive signals of the ECL level having phases opposite to each other;

a current mirror arrangement including n-channel input and output MOSFETs, the n-channel input MOSFET having an input, corresponding to an input of said current mirror arrangement, that receives the drain output from one of said pair of p-channel MOSFETs, and the drain of the n-channel output MOSFET being coupled to the drain of the other one of said pair of p-channel MOSFETs through a resistor;

totem pole-type push-pull output transistors having bases that are respectively connected to the drain of said other one of said pair of p-channel MOSFETs and to the source of the n-channel output MOSFET of said current mirror arrangement, the drain of the n-channel output MOSFET being an output of said current mirror arrangement and coupled to an emitter of that one of the output transistors having its base coupled to the drain of said other one of said pair of p-channel MOSFETs; and a resistor element that is connected across the base and the emitter of that one of the output transistors having its base connected to the source of the n-channel output MOSFET so as to drain the base charge thereof.

7. A semiconductor integrated circuit device comprising:

a first terminal for supplying a positive power source potential;

a second terminal for supplying a ground potential;

a third terminal for supplying a negative power source potential;

a TTL input buffer coupled to receive first input signals of a TTL level and for converting said first output signals into first internal signals of a CMOS level;

an ECL input buffer coupled to receive second input signals of an ECL level and for providing second internal signals of the ECL level;

an input level converting circuit which receives third input signals of the TTL level and converts them into third internal signals of the ECL level;

a first internal gate circuit which receives at input terminals thereof the first internal signals and generates at output terminals thereof first output signals of the CMOS level, wherein said first internal gate circuit is coupled to said first and second terminals and includes a plurality of logic gates ones of which have input stages comprised of P- and N-channel MOSFETs and output stages comprised of bipolar transistors;

a second internal gate circuit which receives at input terminals thereof said second and third internal signals and generates second and third output signals of the ECL level, wherein said second internal gate circuit is coupled to said second and third terminals and includes a plurality of logic gates each of which has a pair of differentially connected bipolar transistors and load resistors coupled to collectors of the pair of differentially connected bipolar transistors;

an output level converting circuit coupled to receive said second output signals and for converting said second output signals into first TTL output signals;

a TTL output buffer which receives said first output signals and generates second TTL output signals; and an ECL output buffer that receives said third output signals and generates ECL output signals, wherein the first and second internal gate circuits include a plurality of basic cells each of which has two P-channel MOSFETs, two N-channel MOSFETs, three bipolar transistors and five resistors as circuit elements, and wherein the logic gates in said first and second internal gate circuits are formed in the basic cells by connecting predetermined circuit elements.

8. A semiconductor integrated circuit device comprising:

TT1 input buffer means for converting an input signal of a TTL level into a first signal of a CMOS level, said TTL input buffer means including an input stage for converting the input signal of the TTL level into a first signal of an ECL level, a first buffer circuit coupled to receive the first signal of the ECL level and a first level converting circuit for converting an output signal of said first buffer circuit into the first signal of the CMOS level;

ECL input buffer means for converting an input signal of an ECL level into a second signal of the CMOS level, said ECL input buffer means including an input stage for providing the second signal of the ECL level in response to the input signal of the ECL level, a second buffer circuit coupled to receive the second signal of the ECL level and a second level converting circuit for converting an output signal of said second buffer circuit into the second signal of the CMOS level;

an internal logic circuit which receives at inputs thereof the first and second signals of the CMOS level and generates at outputs thereof output signals of the CMOS level;

TTL output buffer means coupled to receive one of the output signals of the CMOS level and for converting the said one of the output signals into an output signal of the TTL level, the TTL output buffer means including a third level converting circuit for converting the said one of the output signals of the CMOS level into a third signal of the ECL level, a fourth level converting circuit for converting the third signal of the ECL level into a second signal of the TTL level and a TTL output stage coupled to receive the second signal of the TTL level and for generating the output signal of the TTL level; and ECL output buffer means coupled to receive another of the output signals of the CMOS level and for converting the said another of the output signals into an output signal of the ECL level, said ECL output buffer means including a fifth level converting circuit for converting the said another of the output signals of the CMOS level into a fourth signal of the ECL level, a third buffer circuit coupled to receive the fourth signal of the ECL level and an ECL output stage coupled to said third buffer circuit and for generating the output signal of the ECL level.

9. A semiconductor integrated circuit device according to claim 8, wherein said first buffer circuit has a circuit configuration which is the same as that of said second buffer circuit, and wherein said first level converting circuit has a circuit configuration which is the same as that of said second level converting circuit.

10. A semiconductor integrated circuit device according to claim 9, wherein each of said first and second buffer circuits includes a pair of differentially connected bipolar transistors, a current source circuit coupled to commonly connected emitters of said pair of differentially connected bipolar transistors, and a pair of emitter follower transistors having the bases thereof coupled to collectors of the pair of differentially connected bipolar transistors.

11. A semiconductor integrated circuit device according to claim 9, wherein each of the first and second level converting circuits includes an input stage comprised of P- and N-channel MOSFETs and an output stage comprised of at least one bipolar transistor.

12. A semiconductor integrated circuit device according to claim 8, wherein each of said third and fifth level converting circuits includes an input stage comprised of P- and N-channel MOSFETs and an output stage comprised of at least one bipolar transistor.

13. A semiconductor integrated circuit device according to claim 8, wherein each of said fourth level converting circuit and said third buffer circuit includes a pair of differentially connected bipolar transistors and load elements coupled to collectors of said differentially connected transistors, respectively.

14. A semiconductor integrate circuit device according to claim 8, wherein said internal logic circuit includes a plurality of gate circuits, ones of which include input stages comprised of P- and N-channel MOSFETs and output stages comprised of bipolar transistors.

15. A semiconductor integrated circuit device according to claim 10, wherein each of the first and second level converting circuits includes an input stage comprised of P- and N-channel MOSFETs and an output stage comprised of at least one bipolar transistor.

16. A semiconductor integrated circuit device according to claim 15, wherein each of said third and fifth level converting circuits includes an input stage comprised of P- and N-channel MOSFETs and an output stage comprised of at least one bipolar transistor.

17. A semiconductor integrated circuit device according to claim 16, wherein each of said fourth level converting circuit and said third buffer circuit includes a pair of differentially connected bipolar transistors and load elements coupled to collectors of said differentially connected transistors, respectively.

18. A semiconductor integrated circuit device according to claim 17, wherein said internal logic circuit includes a plurality of gate circuits, ones of which include input stages comprised of P- and N-channel MOSFETs and output stages comprised of bipolar transistors.

19. A semiconductor integrated circuit device according to claim 8, wherein each of the first and second level converting circuits includes an input stage comprised of P- and N-channel MOSFETs and an output stage comprises of at least one bipolar transistor.

20. A semiconductor integrated circuit device according to claim 9, wherein each of said third and fifth level converting circuit includes an input stage comprised of P- and N-channel MOSFETs and an output stage comprised of at least one bipolar transistor.

21. A semiconductor integrated circuit device according to claim 20, wherein each of said fourth level converting circuit and said third buffer circuit includes a pair of differentially connected bipolar transistors and load elements coupled to collectors of said differentially connected transistors, respectively.

22. A semiconductor integrated circuit device according to claim 21, wherein said internal logic circuit includes a plurality of gate circuits, ones of which include input stages comprised of P- and N-channel MOSFETs and output stages comprised of bipolar transistors.

23. A semiconductor integrated circuit device according to claim 9, wherein each of said fourth level converting circuit and said third buffer circuit includes a pair of differentially connected bipolar transistors and load elements coupled to collectors of said differentially connected transistors, respectively.

24. A semiconductor integrated circuit device according to claim 9, wherein said internal logic circuit includes a plurality of gate circuits, ones of which include input stages comprised of P- and N-channel MOSFETs and output stages comprised of bipolar transistors.

* * * * *